United States Patent [19]

Maeda

[11] Patent Number: 5,471,082
[45] Date of Patent: Nov. 28, 1995

[54] SEMICONDUCTOR DEVICE AND A METHOD FOR MANUFACTURING THE SAME

[75] Inventor: Hiroshi Maeda, Matsubara, Japan

[73] Assignee: Sharp Kabushiki Kaisha, Japan

[21] Appl. No.: 305,601

[22] Filed: Sep. 14, 1994

[30] Foreign Application Priority Data

Dec. 27, 1993 [JP] Japan .................. 5-333781

[51] Int. Cl.$^6$ .................. H01L 27/02
[52] U.S. Cl. .................. 257/362; 257/370; 257/577; 257/592
[58] Field of Search .................. 257/362, 369, 257/370, 378, 565, 577, 592, 655

[56] References Cited

FOREIGN PATENT DOCUMENTS 61-36711  8/1986  Japan .
62-69678  3/1987  Japan .

Primary Examiner—Mark V. Prenty
Attorney, Agent, or Firm—Nixon & Vanderhye

[57] ABSTRACT

A semiconductor device having an electrostatic discharge protection device, in which the electrostatic discharge protection device comprises a vertical type bipolar transistor including, a semiconductor substrate, an epitaxial layer laminated on the semiconductor substrate, a buried collector of a first conductive type which is formed of the semiconductor substrate or which is formed from the surface of the semiconductor substrate to the epitaxial layer, a base of a second conductive type which is a lightly doped well and formed on the epitaxial layer, and an emitter of the first conductive type and formed on the surface layer of the base of the second conductive type; and in which the depth of the diffusion of the base being in the range from 0.8 to 2.3 microns, and the base and the emitter being shorted with each other.

12 Claims, 35 Drawing Sheets

FIG. 11
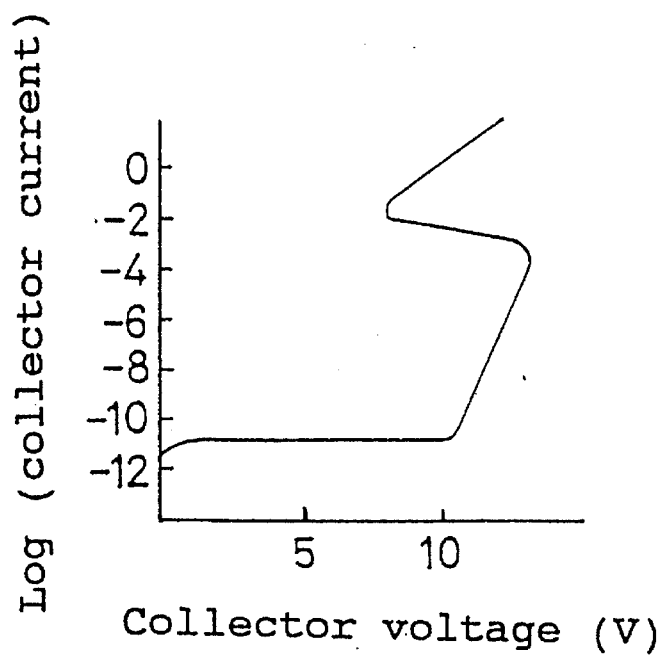
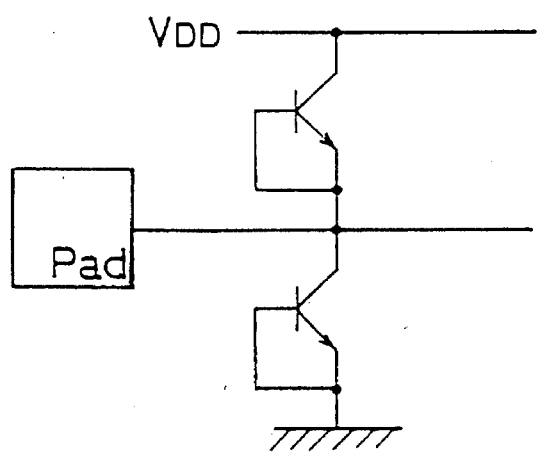
FIG. 12

FIG. 21
N⁺(100)　　　41(41a)
Nch-MOS  Pch-MOS  ESD
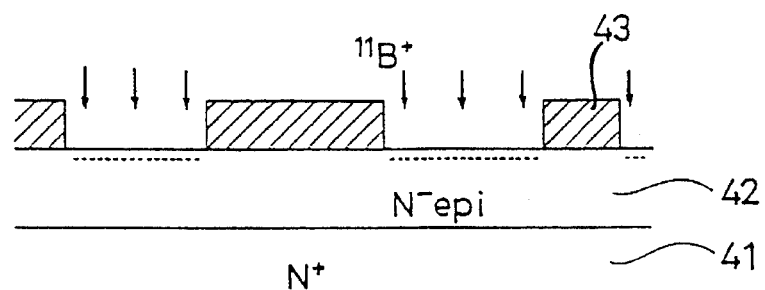
FIG. 22
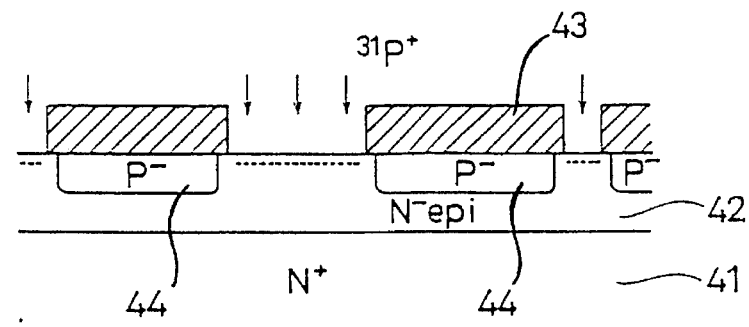
FIG. 23
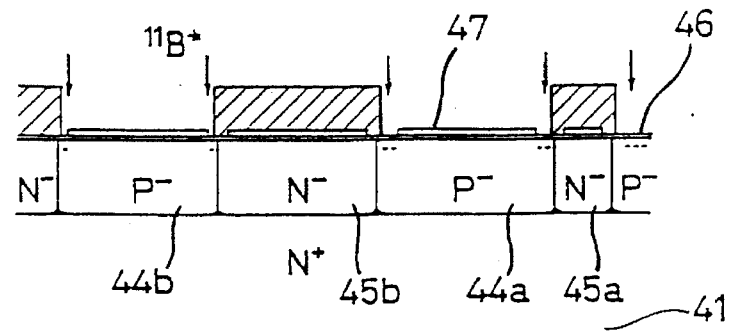
FIG. 24

FIG. 29
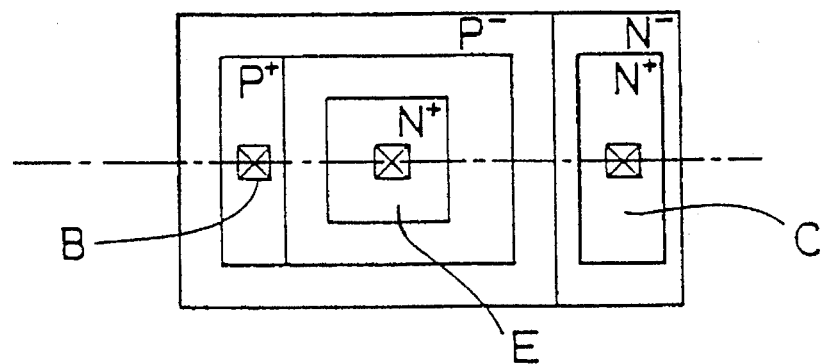
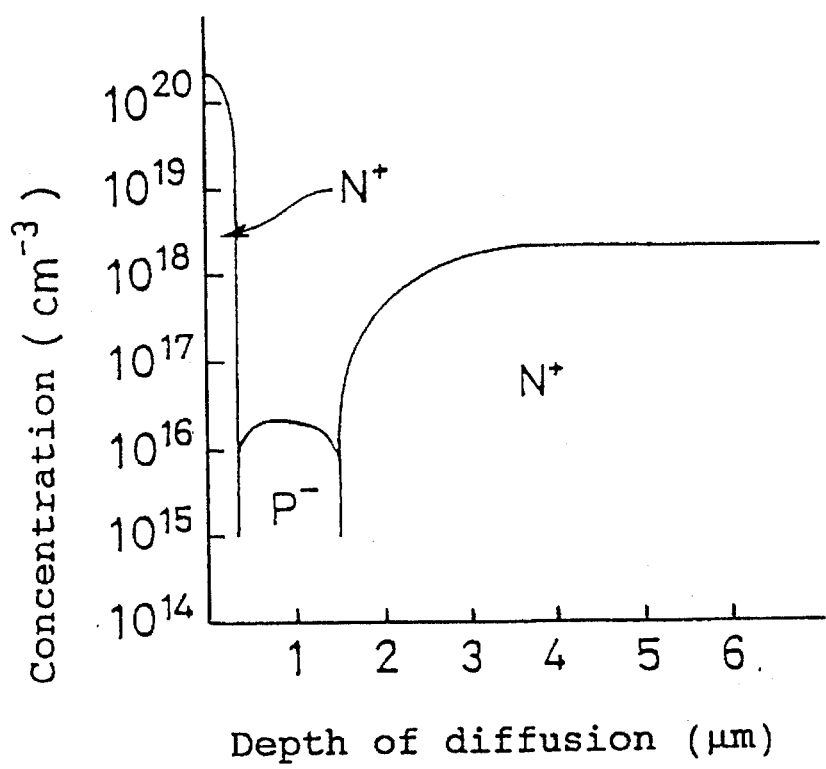
FIG. 30

FIG. 39
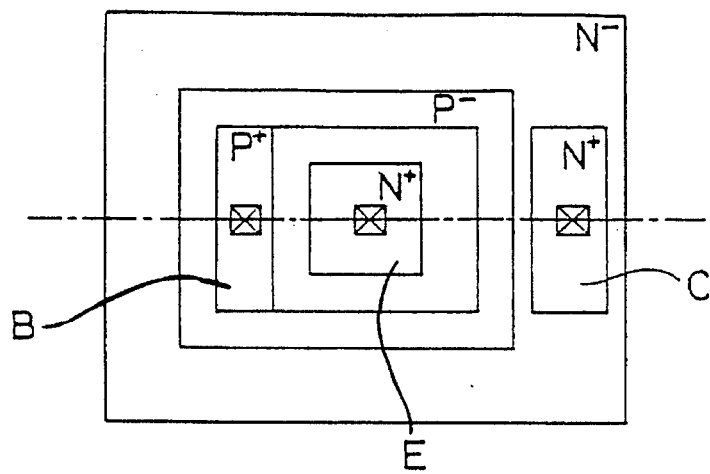
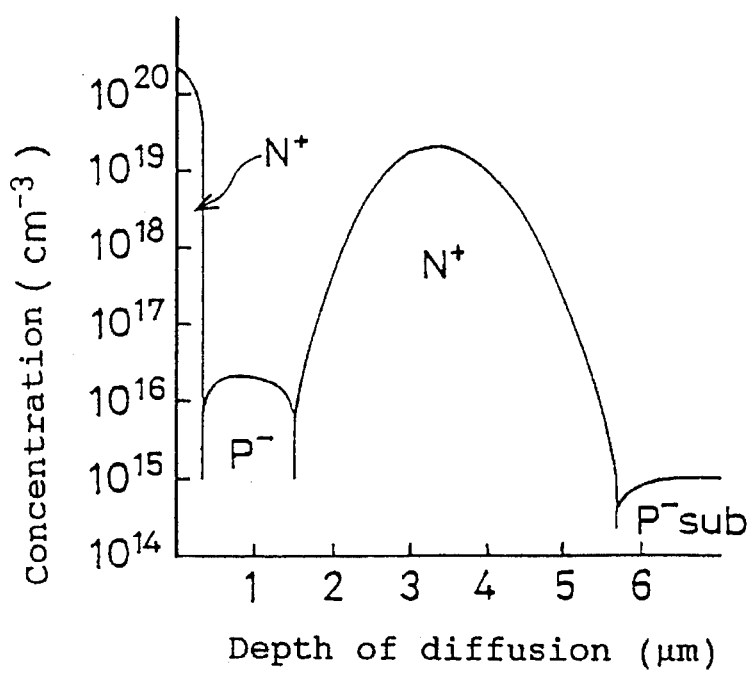
FIG. 40

FIG. 109 (PRIOR ART)
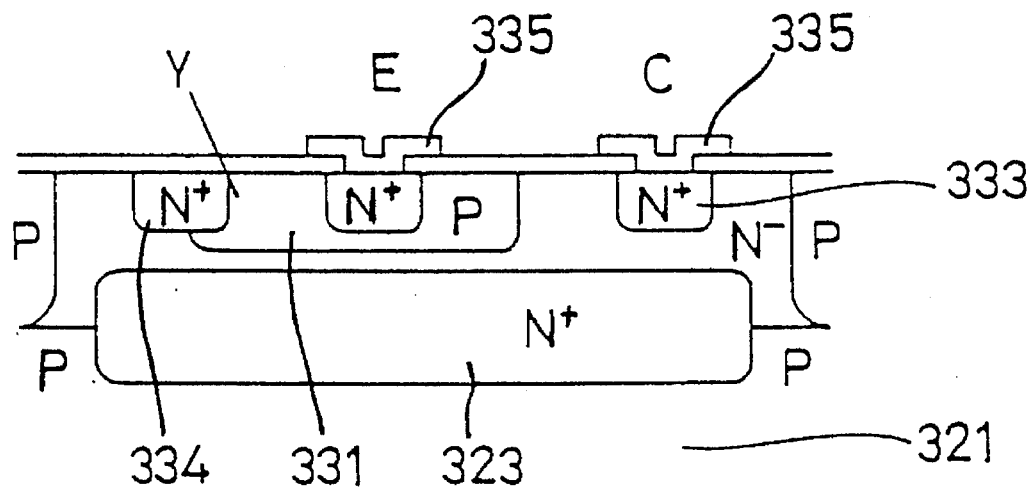
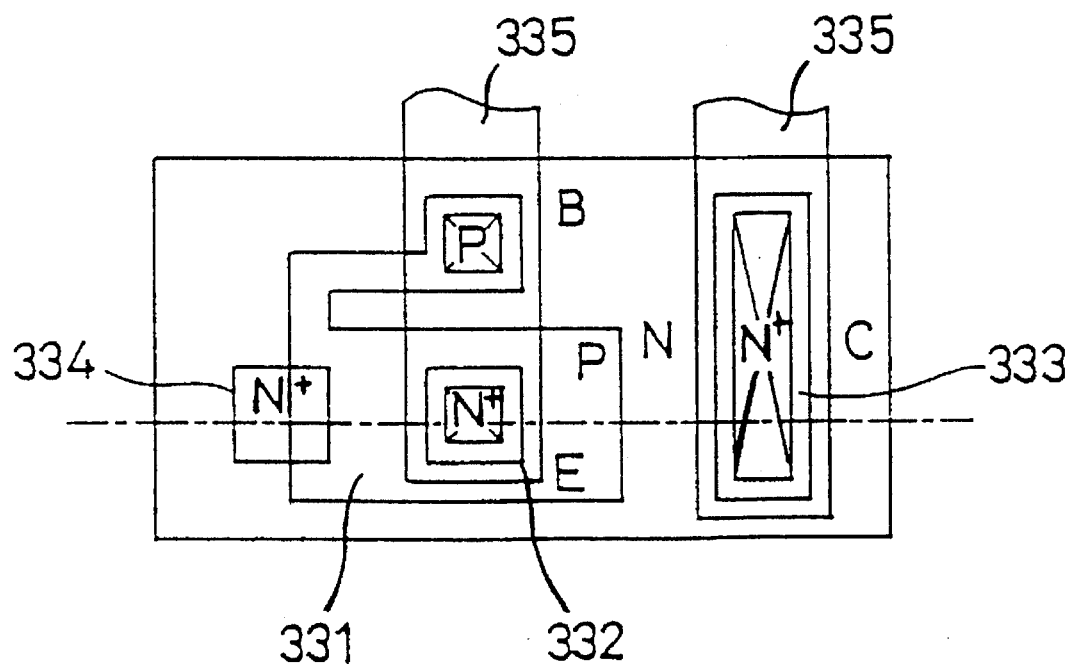
FIG. 110 (PRIOR ART)

SEMICONDUCTOR DEVICE AND A METHOD FOR MANUFACTURING THE SAME

BACKGROUND OF THE INVENTION

1. Field of the Invention

The present invention relates to a semiconductor device and a method for manufacturing the same. In particular, it relates to a semiconductor device such as MOS, BiCMOS and bipolar transistor which includes a vertical type bipolar transistor therein as an electrostatic discharge protection device (ESD protection device) and the method for manufacturing the same.

2. Description of the Related Art

Various type of semiconductor devices providing a protective circuit for the device have been developed.

(i) As an example, Japanese Unexamined Patent Publication Sho 62 (1987)-69678 discloses a horizontal type bipolar transistor as an electrostatic discharge protection device which is formed without using an epitaxial layer in the manufacturing process for MOS transistor. In the horizontal bipolar transistor, an avalanche breakdown current is used as a trigger and an electric current flows by snap-back. A method for manufacturing the horizontal bipolar transistor is described as follows.

As shown in FIG. 94, a thermal oxide film and a nitride film are formed on an entire P⁻ substrate 301 which serves as a base and has a concentration of about $2 \times 10^{15}$ cm$^{-3}$, and then the surface of the substrate is etched back so as to leave a nitride film 302 in a region used for an active region.

Subsequently, as shown in FIG. 95, the substrate is oxidized by LOCOS method and $^{49}$BF$_2^+$ ions are implanted to a desired region for forming a base contact diffusion region by using a resist as a mask 303.

Then, $^{75}$As$^+$ ions are implanted to a desired region for forming an emitter and collector by using a resist as a mask 304 as shown in FIG. 96. The emitter and the base are shorted with each other by using a metal wiring (represented by the reference numeral 305 in FIG. 98) as shown in FIG. 97, thereby obtaining the horizontal type bipolar transistor.

FIG. 98 shows a plan view of the semiconductor device of this type. When a reverse bias is applied to the collector in the horizontal bipolar transistor of the electrostatic discharge protection device, avalanche breakdown occurs between the collector and the base. The avalanche breakdown current triggers to function a transistor and induces a snap-back, whereby an electric current flows. If a semiconductor device employs the horizontal bipolar transistor in an input part of the circuit, excessive current and voltage caused by static electricity are allowed to escape from the circuit, so that the inside circuit can be protected.

(ii) Alternatively, in addition to the MOS process described above, another device comprising a horizontal bipolar transistor as an electrostatic discharge protection device has been developed in which snap-back occurs by using a punch-through breakdown as a trigger.

In this type of device, as shown in FIG. 99, a thermal oxide film and a nitride film are formed on a P⁻ substrate 311, and then the nitride film formed on a device isolation formation region is removed to leave a nitride film 312 in a region used for an active region. The distance X between the emitter and collector formed therein is arranged to be shorter than that of the first example described above in order to induce punch-through breakdown between the collector and emitter at a voltage lower than that of inducing avalanche breakdown between the collector and base.

Subsequently, the substrate is oxidized by LOCOS method and the nitride film 312 is removed as shown in FIG. 100. Then $^{49}$BF$_2^+$ ions are implanted to a desired region for forming a base contact diffusion region by using a resist as a mask 313.

After that, $^{75}$As$^+$ ions are implanted to a desired region for forming an emitter and collector by using a resist as a mask 314 as shown in FIG. 101.

The emitter and the base are shorted with each other by using a metal wiring (represented by 315 in FIG. 103) as shown in FIG. 102, thereby obtaining the horizontal type bipolar transistor.

FIG. 103 shows a plan view of the semiconductor device of this type. When a reverse bias is applied to the collector in the horizontal bipolar transistor of the electrostatic discharge protection device, punch-through breakdown occurs between the collector and the emitter. The punch-through breakdown current triggers to function a transistor and induces a snap-back, whereby an electric current flows. If a semiconductor device employs the horizontal type bipolar transistor in an input part of the circuit, the excessive current and voltage caused by static electricity are allowed to escape from the circuit, so that the inside circuit can be protected.

(iii) Further, Japanese Patent Publication Sho 61 (1986)-36711 discloses a vertical type bipolar transistor as an electrostatic discharge protection device, in which an avalanche breakdown current is used as a trigger and induces snap-back.

As shown in FIG. 104, spin-on-glass (SOG) containing antimony (Sb), not shown, is applied to a P type substrate 321 to form an N⁺ buried collector 323 by driving in, and the SOG on the substrate 321 is removed.

Next, as shown in FIG. 105, an N epitaxial layer 324 is grown on the substrate 321 and the surface of the substrate 321 is oxidized by thermal treatment to form an SiO₂ film 325. After etching SiO₂ 325 by using a resist as a mask 326 for forming P well to be used as a device isolation region, $^{11}$B$^+$ ions are implanted.

FIG. 106 shows that a P well 327 is formed by conducting P well thermal diffusion for forming an device isolation region and then a resist 328 is applied and patterned by photolithographic process, and that the oxide film 325 in the base formation region is etched and $^{11}$B$^+$ ions are implanted.

FIG. 107 shows that a resist 329 is applied on the substrate 321 on which the base 331 is formed and then an oxide film 330 on the emitter and collector contact diffusion region of the bipolar transistor is etched and $^{75}$As$^+$ ions are implanted. At this time, the diffusion region bridging from the base to the collector region of the N epitaxial layer 324 is simultaneously formed.

FIG. 108 shows that a contact for forming an electrode is formed after forming an emitter 332, collector contact diffusion region 333 and diffusion region 334.

Then, Al—Si electrode 335 is formed as shown in FIG. 109 such that the emitter and the base are shorted with each other as shown in FIG. 110.

FIG. 111 shows an impurity concentration profile beneath the emitter.

The bipolar transistor used as the electrostatic discharge protection device has an emitter concentration of about $2 \times 10^{20}$ cm$^{-3}$, base concentration of about $5 \times 10^{17}$ cm$^{-3}$ and collector N⁻ epitaxial concentration of about $5 \times 10^{15}$ cm$^{-3}$. When the reverse bias is applied to the device, avalanche breakdown occurs at about 6 V in a region Y (FIG. 109) near the surface of p-n junction between the collector and the base. The avalanche breakdown current triggers to function a transistor and induces a snap-back as shown in FIG. 112 As the base concentration is $5\times10^{17}$ cm$^{-3}$, punch-through does not occur between the collector and the emitter. Accordingly, if a semiconductor device employs the vertical type transistor in an input part of the circuit, excessive current and voltage caused by static electricity are allowed to escape from the circuit, so that the inside circuit can be protected.

(iv) In BiCMOS process, the horizontal and vertical bipolar transistors are formed in the MOS and bipolar portions, respectively to form a desired BiCMOS.

However, when excessive current flows in the horizontal bipolar transistor of the MOS processes (i) and (ii) which is used as the electrostatic discharge protection device, the instantaneous excessive energy applied to the transistor can not be absorbed sufficiently, so that the p-n junction in the inside circuit or the gate oxide film of the MOS transistor may be broken. This phenomena is induced because the junction in the device is so shallow owing to the horizontal arrangement of the horizontal bipolar transistor that the area through which the electric current passes is limited. Therefore, it is necessary to enlarge the area of the device in order to provide sufficient device ability.

When the vertical bipolar transistor is used as the electrostatic discharge protection device of the bipolar process (iii), the device is in the state of avalanche breakdown until transistor function and snap-back occur. The region having the avalanche breakdown is limited to the diffusion edge where the electric field is concentrated and a current density is very high. Accordingly, the transistor is heated up at the diffusion edge and the device may be broken.

SUMMARY OF THE INVENTION

The present invention provides a first semiconductor device having an electrostatic discharge protection device, in which the electrostatic discharge protection device comprises a vertical type bipolar transistor including, a semiconductor substrate, an epitaxial layer laminated on the semiconductor substrate, a buried collector of a first conductive type which is formed of the semiconductor substrate or which is formed from the surface of the semiconductor substrate to the epitaxial layer, a base of a second conductive type which is a lightly doped well and formed on the epitaxial layer, and an emitter of the first conductive type and formed on the surface layer of the base of the second conductive type; and in which the depth of the diffusion of the base being in the range from 0.8 to 2.3 microns, and the base and the emitter being shorted with each other.

The present invention also provides a second semiconductor device having an electrostatic discharge protection device, in which the electrostatic discharge protection device comprises a vertical type bipolar transistor including, a semiconductor substrate, an epitaxial layer laminated on the semiconductor substrate, a buried collector of a first conductive type which is formed of the semiconductor substrate or which is formed from the surface of the semiconductor substrate to the epitaxial layer, a base of a second conductive type which is a lightly doped well and formed on the epitaxial layer, an emitter of the first conductive type and formed on the surface layer of the base of the second conductive type and a collector sinker region of the first conductive type which is adjacent to the base of the second conductive type and provided with a collector contact diffusion region;

the base comprising a highly doped diffusion layer of the second conductive type in a surface of the base, which contacts at least with the collector contact diffusion region in the collector sinker region of the first conductive type, the depth of the diffusion of the base of the second conductive type being in the range from 0.8 to 2.3 microns, and the base type and the emitter being shorted with each other.

The present invention also preovides a method for manufacturing the first semiconductor device provided with the electrostatic discharge protection device and N or P channel MOS or CMOS transistor, which comprises the steps in which:

(i) the lightly doped well of the second conductive type is formed in the semiconductor substrate as MOS transistor formation region, and simultaneously the base of the second conductive type of the electrostatic discharge protection device is formed at an impurity concentration of about $1\times10^{16}$ cm$^{-3}$ to $3\times10^{16}$ cm$^{-3}$, and (ii) the source/drain region of the first conductive type is formed in the lightly doped well of the second conductive type of MOS transistor, and simultaneously the emitter of the first conductive type is formed in the base of the second conductive type of the electrostatic discharge protection device.

The present invention also provides a method for manufacturing the first semiconductor device provided with the electrostatic discharge protection device and bipolar transistor, which comprises the steps in which:

(i) the lightly doped well of the second conductive type for the bipolar transistor is formed as a device isolation, and simultaneously the base of the second conductive type of the electrostatic discharge protection device is formed at an impurity concentration of about $1\times10^{16}$ cm$^{-3}$ to $3\times10^{16}$ cm$^{-3}$, and (ii) the base of the second conductive type of the bipolar transistor is formed, and then the emitter of the first conductive type in the inside of the base of the second conductive type of the bipolar transistor and the emitter of the first conductive type of the electrostatic discharge protection device are simultaneously formed.

The present invention also provides a method for manufacturing the first semiconductor device provided with BiCMOS and electrostatic discharge protection device, which comprises steps in which:

(i) the lightly doped well of the second conductive type for MOS transistor and the lightly doped well of the second conductive type for a device isolation of bipolar transistor are formed, and simultaneously the base of the second conductive type of the electrostatic discharge protection device is formed at an impurity concentration of about $1\times10^{16}$ cm$^{-3}$ to $3\times10^{16}$ $^{cm-3}$, and (ii) the base of the second conductive type of the bipolar transistor is formed, and then the source/drain region of MOS transistor and the emitter of the first conductive type in the inside of the base of the second conductive type of the bipolar transistor and the emitter of the first conductive type of the electrostatic discharge protection device are simultaneously formed.

The present invention also provides a method for manufacturing the second semiconductor device provided with the N or P channel MOS or CMOS transistor and electrostatic discharge protection device, which comprises steps in which:

(i) the lightly doped well of the second conductive type for MOS transistor, and simultaneously the base of the second conductive type of the electrostatic discharge protection device is formed at an impurity concentration of about $1\times10^{16}$ cm$^{-3}$ to $3\times10^{16}$ cm$^{-3}$;

(ii) the highly doped diffusion region of the second conductive type is formed for retaining a surface reverse voltage in a device isolation region of the lightly doped well of the second conductive type of MOS transistor, and simultaneously the highly doped diffusion region of the second conductive type is formed in the base of the second conductive type of the electrostatic discharge protection device is formed; and (iii) source/drain region of the first conductive type is formed in the lightly doped well of the second conductive type of MOS transistor, and simultaneously the emitter of the first conductive type is formed in the base of the second conductive type of the electrostatic discharge protection device, and the collector contact diffusion region is formed in the surface layer of the collector sinker region of the first conductive type so as to connect with the highly doped diffusion layer of the second conductive type of the base of the second conductive type for the electrostatic discharge protection device.

The present invention also provides a method for manufacturing the second semiconductor device provided with the bipolar transistor and electrostatic discharge protection device, which comprises steps in which:

(i) the lightly doped well of the second conductive type for the bipolar transistor is formed as a device isolation, and simultaneously the base of the second conductive type of the electrostatic discharge protection device is formed at an impurity concentration of about $1\times10^{16}$ cm$^{-3}$ to $3\times10^{16}$ cm$^{-3}$;

(ii) the highly doped diffusion layer of the second conductive type for retaining the surface reverse voltage is formed in the device isolation formation region of the lightly doped well of the second conductive type of the bipolar transistor and simultaneously the highly doped diffusion layer of the second conductive type is formed in the base of the second conductive type of the electrostatic discharge protection device; and (iii) the base of the second conductive type of the bipolar transistor is formed, the emitter of the first conductive type is formed in the base of the second conductive type of the bipolar transistor and the emitter of the first conductive type is formed in the base of the second conductive type of the electrostatic discharge protection device, and the collector contact diffusion region is formed in the surface layer of the collector sinker region of the first conductive type so as to connect with the highly doped diffusion layer of the second conductive type of the base of the second conductive type of the electrostatic discharge protection device.

The present invention also provdies a method for manufacturing the second semiconductor device provided with BiCMOS and electrostatic discharge protection device, which comprises steps in which:

(i) the lightly doped well of the second conductive type for MOS transistor and the lightly doped well of the second conductive type for device isolation of bipolar transistor are formed, and simultaneously the base of the second conductive type of the electrostatic discharge protection device is formed at an impurity concentration of about $1\times10^{16}$ cm$^{-3}$ to $3\times10^{16}$ cm$^{-3}$;

(ii) the highly doped diffusion region of the second conductive type is formed for retaining the surface reverse voltage in the device isolation formation region of the lightly doped well of the second conductive type of MOS transistor and in the device isolation formation region of the lightly doped well of the second conductive type of the bipolar transistor and simultaneously the highly doped diffusion region of the second conductive type is formed in the base of the second conductive type of the electrostatic discharge protection device; and (iii) the base of the second conductive type of the bipolar transistor is formed, and then the source/drain region of MOS transistor and the emitter of the first conductive type in the base of the second conductive type of the bipolar transistor are formed and simultaneously the emitter of the first conductive type is formed in the electrostatic discharge protection device, and the collector contact diffusion region is formed in the surface layer of the collector sinker region of the first conductive type so as to connect with the highly doped diffusion layer of the second conductive type of the base of the second conductive type of the electrostatic discharge protection device.

In other words, the object of the present invention is to provide a semiconductor device having an electrostatic discharge protection device of which function is improved without increasing manufacturing steps in the process of MOS, BiCMOS, bipolar transistor and the like, and to provide a method for manufacturing the same.

BRIEF DESCRIPTION OF THE DRAWINGS

FIG. 11 is a graph showing a relationship between collector voltage and collector electric current of an electrostatic discharge protection device of Examples 1 to 5.

FIG. 12 is an equivalent circuit showing a main part of a semiconductor device of the present invention.

FIGS. 21 to 24 are a sectional view of a semiconductor device in each step of a first half of manufacturing process of Example 3.

FIG. 29 is a plan view showing an arrangement of a diffusion region in an electrostatic discharge protection device of a semiconductor device of Example 3.

FIG. 30 is a graph showing a concentration profile beneath an emitter of an electrostatic discharge protection device of Examples 3 and 8.

FIG. 39 is a plan view showing an arrangement of a diffusion region of an electrostatic discharge protection device of Examples 4 and 5.

FIG. 40 is a graph showing a concentration profile beneath an emitter of an electrostatic discharge protection device of Examples 4, 5, 9 and 10.

FIGS. 104 to 109 are a sectional view of another conventional semiconductor device in each step of a still another method for manufacturing the same.

FIG. 110 is a plan view of another conventional semiconductor device shown in FIG. 109.

PREFERRED EMBODIMENT OF THE INVENTION

Figure 1:
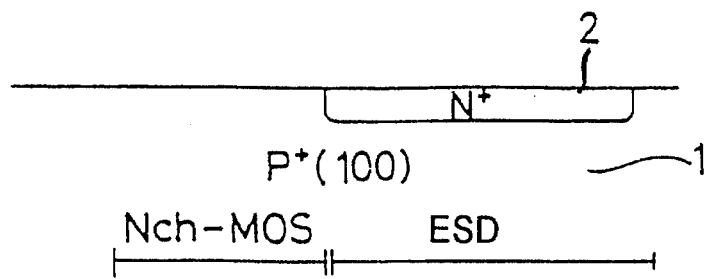
FIGS. 1 to 4 are a sectional view of a semiconductor device in each step of a first half of manufacturing process of Examples 1 of the present invention.

The semiconductor device of the present invention comprises N channel or P channel MOS, CMOS, bipolar transistor or, BiCMOS and the like, and a vertical type bipolar transistor as a electrostatic discharge protection device which includes a buried collector of the first conductive type, a base of the second conductive type and a emitter of the first conductive type. The electrostatic discharge protection device may further comprise a collector sinker region of the first conductive type, a collector contact diffusion region, a highly doped diffusion region of the second conductive type and a plug diffusion region of the first conductive type.

The buried collector of the first conductive type in the electrostatic discharge protection device may be the semiconductor substrate itself or can be formed by forming a buried diffusion region by growing a epitaxial layer after forming the highly doped diffusion region on the semiconductor substrate. The impurity concentration of the buried collector is preferably about $1 \times 10^{18}$ cm$^{-3}$ to $4 \times 10^{19}$ cm$^{-3}$.

The impurity concentration of the base of the second conductive type is preferably about $1 \times 10^{16}$ cm$^{-3}$ to $3 \times 10^{16}$ cm$^{-3}$ and the depth thereof is preferably about 0.8 to 2.3 microns. The base of the second conductive type may comprise a base contact diffusion region. The impurity concentration of the base contact diffusion region is preferably greater than that of the base, for example, about $3 \times 10^{19}$ cm$^{-3}$ to $8 \times 10^{19}$ cm$^{-3}$. The emitter of the first conductive type is formed in the base of the second conductive type. The emitter of the first conductive type is preferably about $1 \times 10^{20}$ cm$^{-3}$ to $4 \times 10^{20}$ cm$^{-3}$. When the collector sinker region of the first conductive type is formed, it is preferable to form it adjacent to the base of the second conductive type. In that case, the impurity concentration of the collector sinker region is preferably about $1\times10^{16}$ cm$^{-3}$ to $3\times10^{16}$ cm$^{-3}$ and the depth thereof is almost similar to that of the base of the second conductive type. The plug diffusion region of the first conductive type having an impurity concentration of about $2\times10^{19}$ cm$^{-3}$ to $5\times10^{19}$ cm$^{-3}$ may be formed in the collector sinker region or a region bringing from the collector sinker region to the base of the second conductive type. Further, the collector contact diffusion region of the first conductive type for obtaining ohmic contact with a collector electrode may be formed in the collector sinker region or the plug diffusion region of the first conductive type. In order to reduce a resistance between the collector sinker region of the first conductive type and the collector electrode, the collector sinker region is formed preferably as the highly doped impurity diffusion region to connect with the collector electrode. However, the highly doped diffusion region must be formed deeply for having the collector sinker region in contact with the buried collector at a high concentration. When impurities are diffused deeply by thermal treatment and the like, the impurities are diffused not only in the vertical direction but also in the horizontal direction to the surface of the substrate, which causes a problem for miniaturizing the device. Therefore, in order to control a contact resistance with the collector electrode while keeping a low concentration of the impurity beneath the collector electrode and controlling the horizontal diffusion to the minimum level, the plug diffusion region and the sinker region having a relatively high concentration is preferably formed in the collector sinker region of the first conductive type.

According to the electrostatic discharge protection device described above, punch-through breakdown occurs between the collector and emitter, and triggers to function transistor thereby inducing snap-back. A depletion layer is extended all over the emitter region and the concentration of electric field is prevented, so that electric current is not concentrated. As a result, a device is prevented from breakdown caused by heat generation such as avalanche breakdown trigger.

Figure 93:
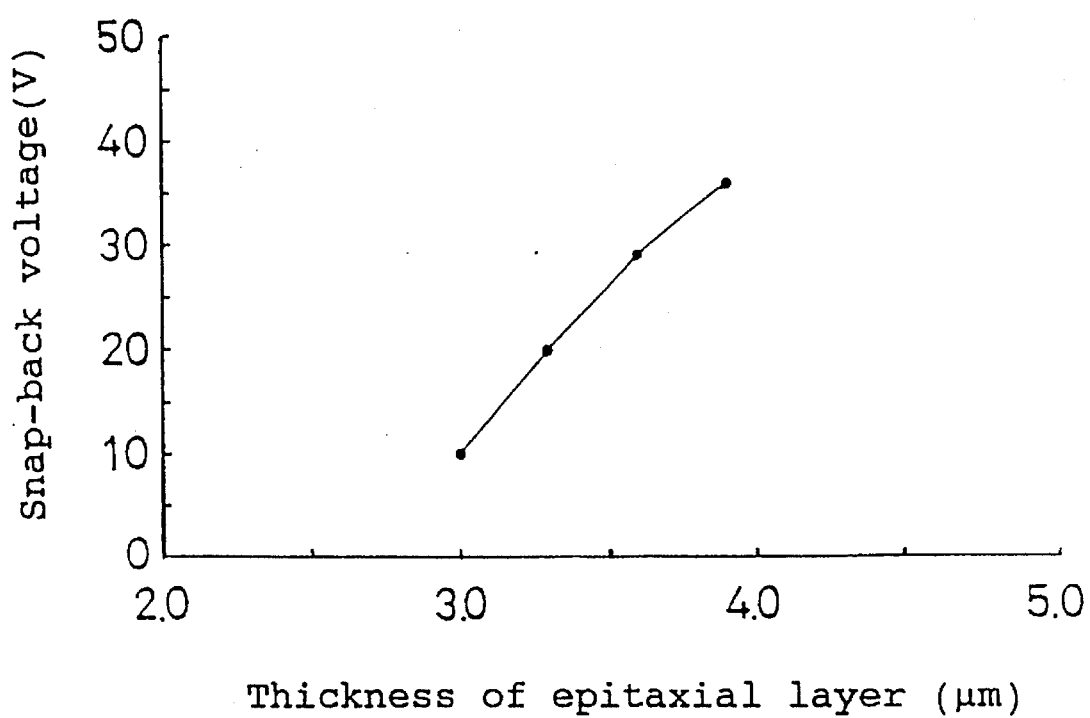
FIG. 93 is a graph showing a relationship between a thickness of an epitaxial layer and snap-back voltage of a semiconductor device of the present invention.
Figure 94:
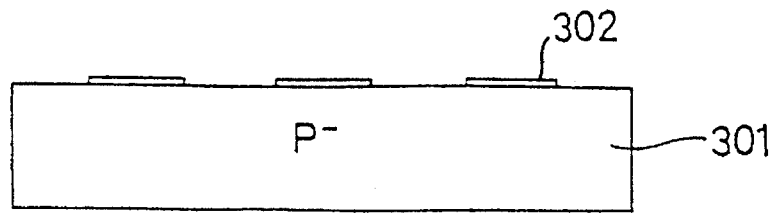
FIGS. 94 to 97 are a sectional view of a conventional semiconductor device in each step of a method for manufacturing the same.
Figure 95:
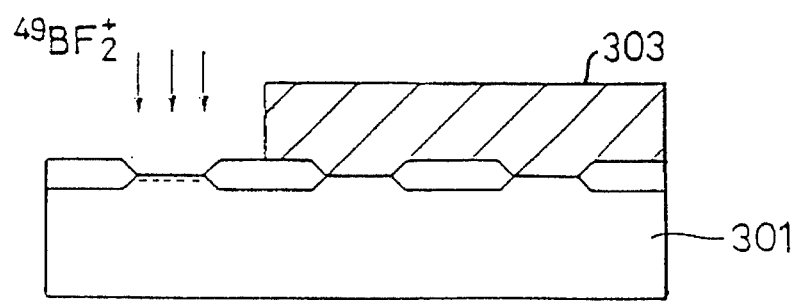
Figure 96:
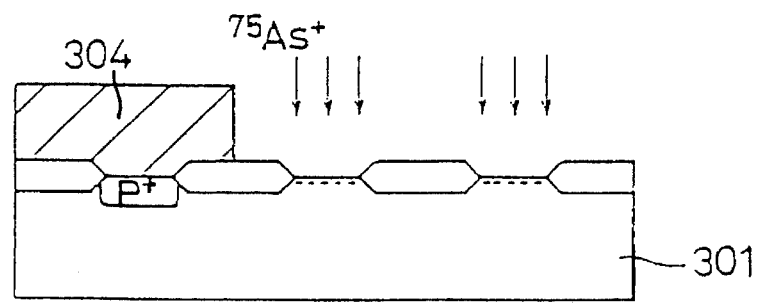
Figure 97:
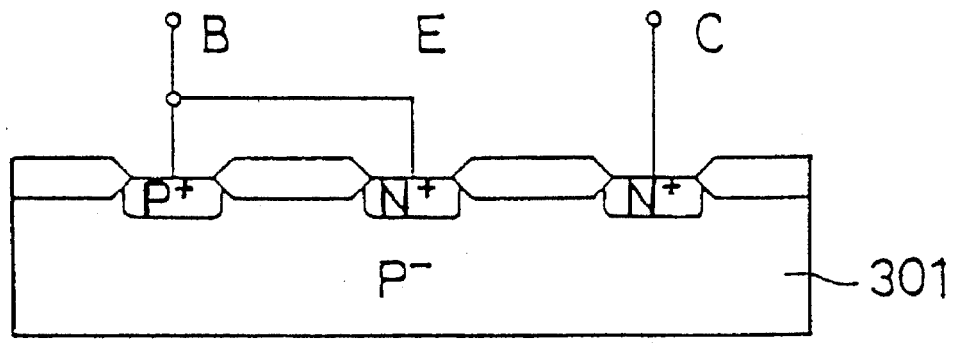
Figure 98:
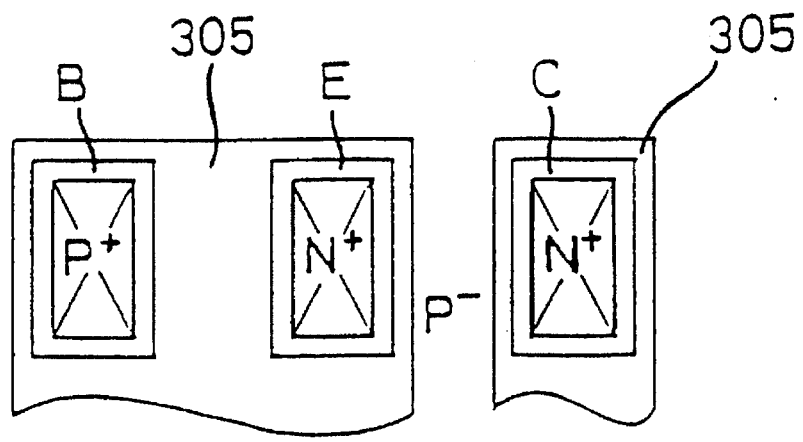
FIG. 98 is a plan view of the conventional semiconductor device shown in FIG. 97.
Figure 99:
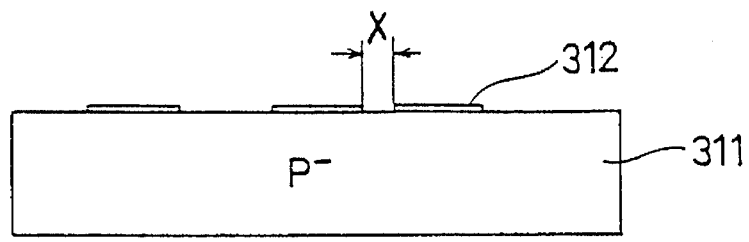
FIGS. 99 to 102 are a sectional view of another conventional semiconductor device in each step of another method for manufacturing the same.
Figure 100:
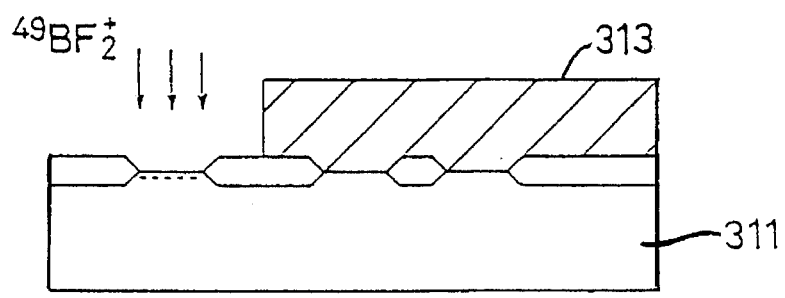
Figure 101:
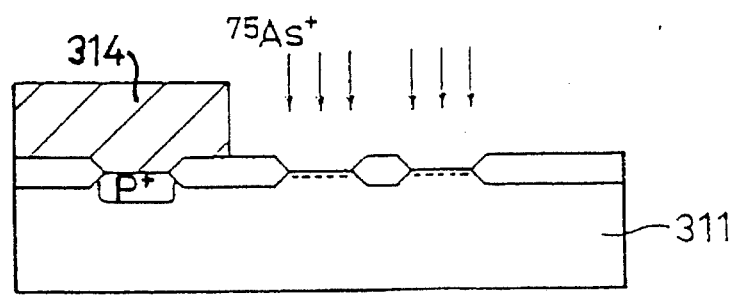
Figure 102:
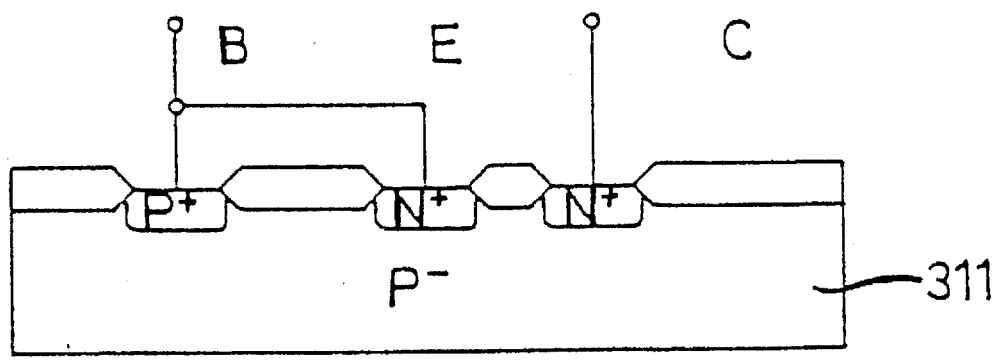
Figure 103:
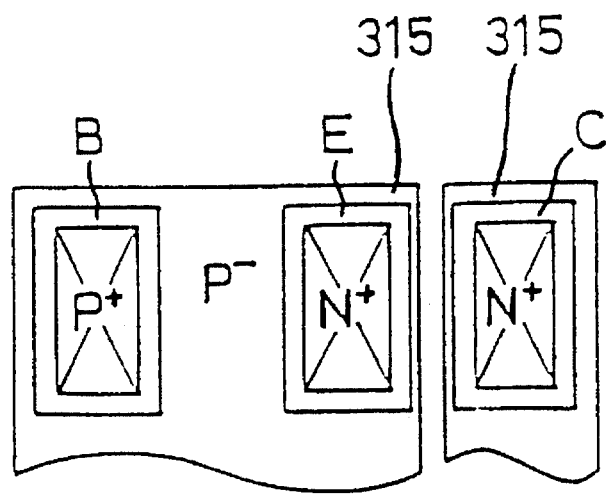
FIG. 103 is a plan view of another conventional semiconductor device shown in FIG. 102.
Figure 104:
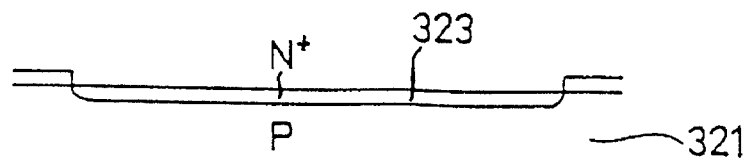
Figure 105:
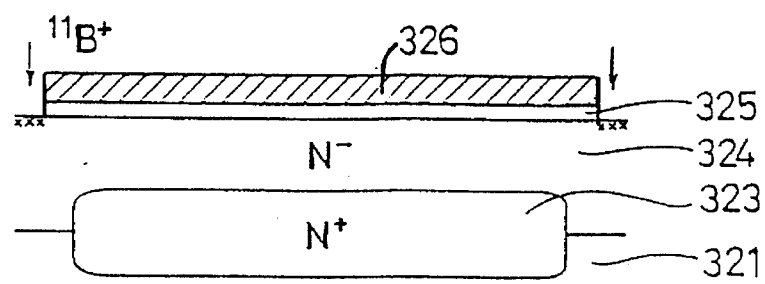
Figure 106:
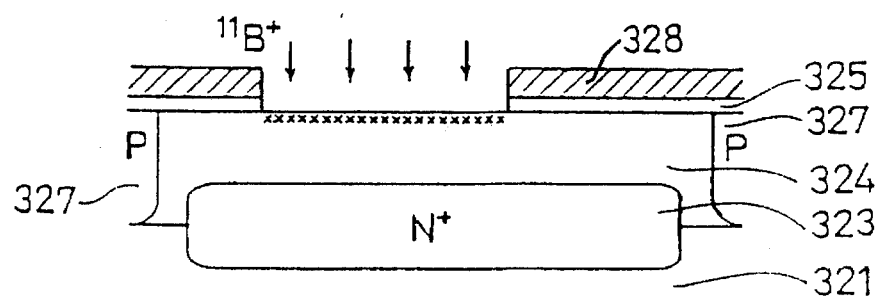
Figure 107:
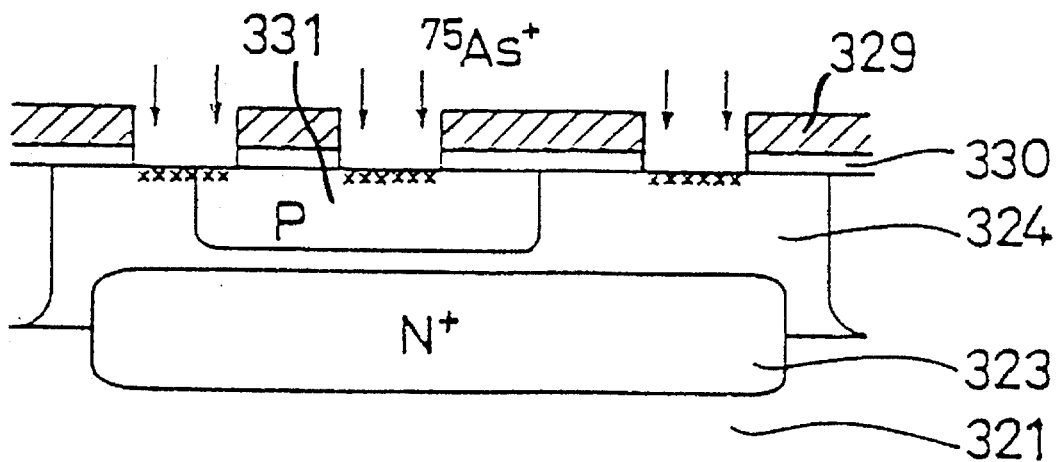
Figure 108:
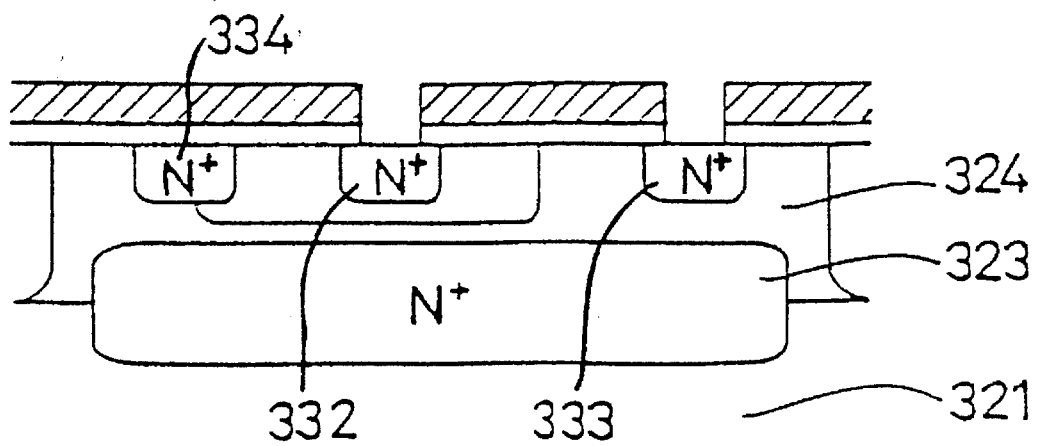
Figure 111:
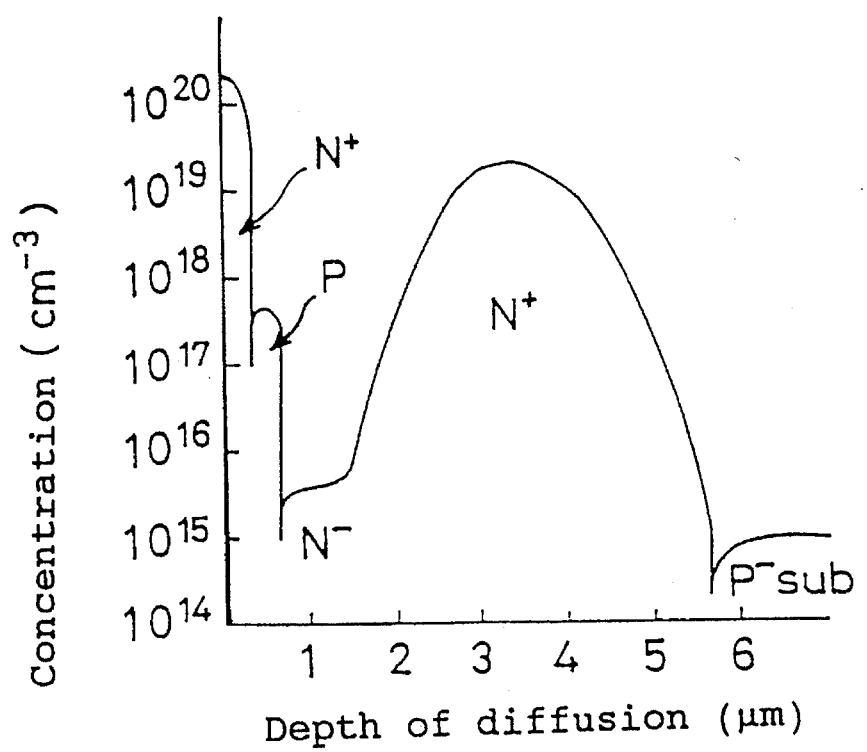
FIG. 111 is a graph showing a concentration profile beneath an emitter of an electrostatic discharge protection device of a conventional semiconductor device.
Figure 112:
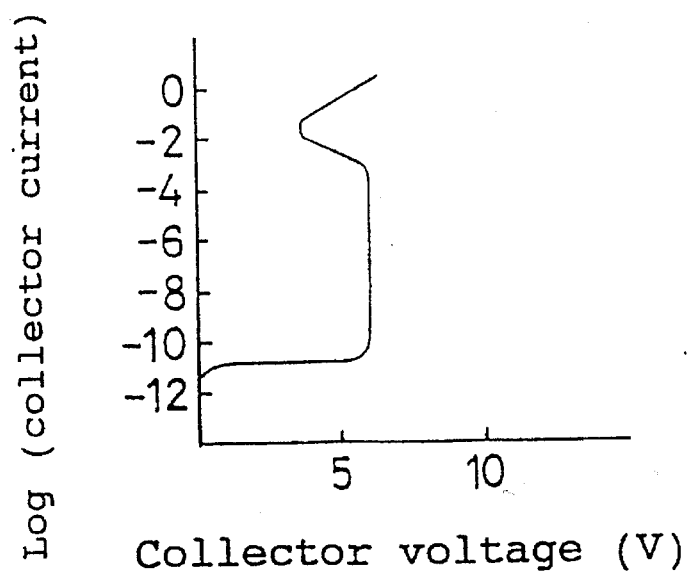
FIG. 112 is a graph showing a relationship between a collector voltage and a collector electric current of an electrostatic discharge protection device of a conventional semiconductor device.

However, the thickness of the epitaxial layer for forming the base of the second conductive type varies by $\pm5\%$ with respect to the desired thickness. Thus, in the manufacturing process, the epitaxial layer is formed to a thickness thicker than the desired thickness, the punch-through breakdown voltage is shifted to a higher voltage as shown FIG. 93. Accordingly, when the punch-through breakdown voltage is shifted to a higher voltage, excessive voltage is applied to the inner circuit of the semiconductor device. The semiconductor device of the present invention comprises an electrostatic discharge protection device of which avalanche breakdown is caused to compensate excessive voltage applied to the inner circuit even when a breakdown voltage is varied.

When the highly doped diffusion region of the second conductive type is formed on the surface of the base of the second conductive type and is located beneath the device isolation region, the highly doped diffusion region preferably contacts with the collector contact diffusion region or the plug diffusion region in the collector sinker region of the first conductive type. The impurity concentration of the highly doped diffusion region of the second conductive type is preferably about $6\times10^{16}$ to $2\times10^{17}$. The depth thereof is not specifically limited, but it is preferable to have a depth which is similar to that of the layer for preventing the reverse of the surface layer of the device isolation region and the like. One end of the highly doped diffusion region is in contact with the collector contact diffusion region or plug diffusion region of the collector sinker region of the first conductive type, and another end thereof preferably extends to the end of the LOCOS oxide film used for the device isolation region and encloses the active region when seen from the top.

The semiconductor device of the present invention comprises the vertical type bipolar transistor as a electrostatic discharge protection device, to which it is not specifically limited. For example, the semiconductor device includes P channel MOS, N channel MOS, CMOS, bipolar transistor, BiCMOS and the combination thereof.

According to the method of the present invention, the device can be formed in the process for forming the P channel MOS, N channel MOS, CMOS, bipolar transistor and BiCMOS which are included in the device without adding a specific step.

The present invention is described in detail with reference to examples as follows. However, it is not intended to limit the scope of the invention thereto.

EXAMPLE 1

Example 1 relates to a MOS type semiconductor device comprising a vertical type bipolar transistor which causes snap-back triggered by punch-through.

As shown FIG. 1, a P$^+$ type silicon substrate 1 (concentration about $2\times10^{18}$ cm$^{-3}$) is used. Firstly, SOG including antimony (Sb) (not shown) is applied on the region for the electrostatic discharge protection device. Then, the substrate is subjected to thermal treatment at 1,150° C. for 600 minutes and antimony is driven in the region, thereby forming an N$^+$ diffusion region 2.

Figure 2:
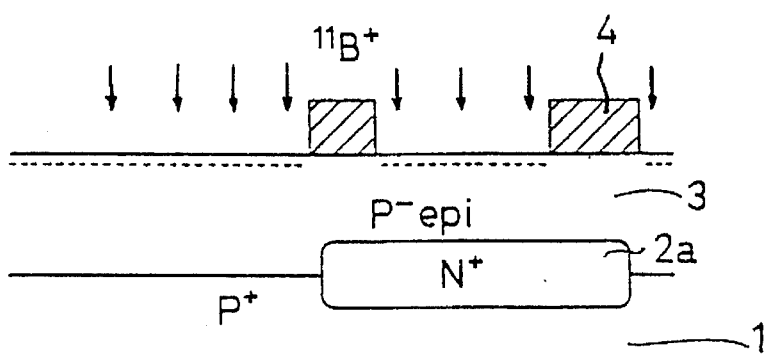

Subsequently, as shown in FIG. 2, a P$^-$ epitaxial layer 3 is grown with a thickness of about 3.1 microns and a buried collector 2a is formed. Then, in order to obtain a P$^-$ well having a relatively high resistivity which works as a base region for the electrostatic discharge protection device and an N channel MOS formation region, a mask 4 is formed with a desired shape by photolithographic process and ions ($^{11}$B$^+$: 150 KeV, $7\times10^{12}$ cm$^{-2}$) are implanted.

Figure 3:
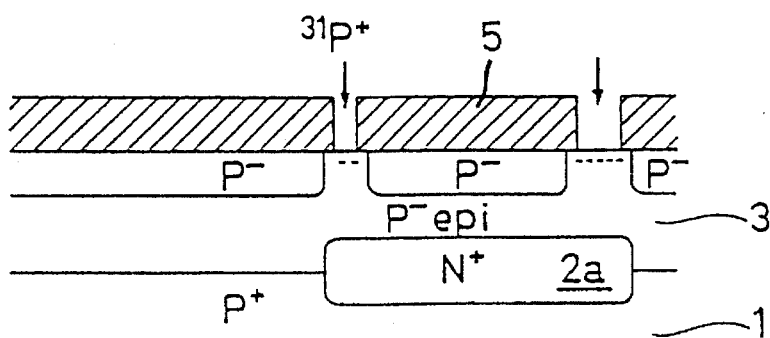

As shown in FIG. 3, a mask 5 is formed with a desired shape by photolithographic process and ions ($^{31}$P$^+$: 150 KeV, $2\times10^{12}$ cm$^{-2}$) are implanted for forming an N$^-$ well which works as a collector sinker region of the electrostatic discharge protection device.

Figure 4:
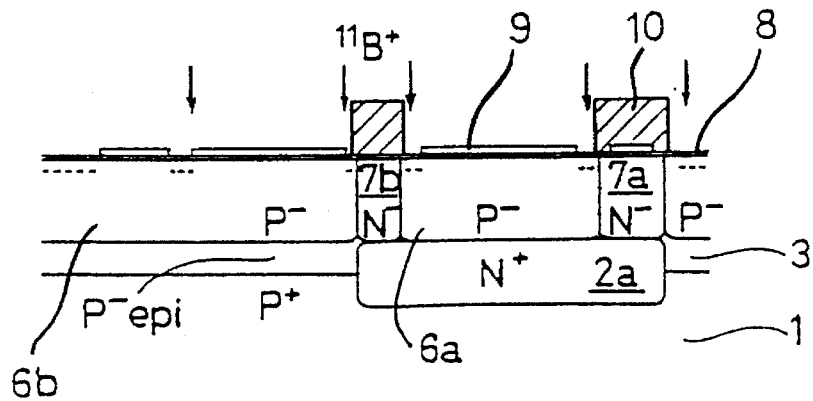

Then, as shown in FIG. 4, the silicon substrate 1 is subjected to thermal treatment at 1,150° C. for 100 minutes, and $^{11}$B$^+$ and $^{31}$P$^+$ are driven in the desired regions, respectively, to form a P well comprising a base for the electrostatic discharge protection device 6a and lightly doped well for forming an N channel MOS transistor 6b and an N$^-$ well comprising a collector sinker region 7a and a collector region 7b. In that case, the surface impurity concentration of the P$^-$ well which comprises the base of the electrostatic discharge protection device 6a and the lightly doped well of the MOS transistor 6b is $2\times10^{16}$ cm$^{-3}$ and the diffusion depth thereof is about 1.5 microns which corresponds to the N$^+$ buried collector 2a (about $2\times10^{19}$ cm$^{-3}$). Further, an SiO$_2$ film 8 is formed with a relatively thin thickness (about 25 nm) by thermal oxidation. A nitride film 9 is formed with a thickness of about 120 nm on the SiO$_2$ film 8 by CVD method and the nitride film 9 is etched so as to leave it only on a place where an active region is to be formed. In order to prevent the P$^-$ well surface from reversing, a mask 10 is formed with a desired shape by photo-lithographic process and ions ($^{11}B^+$: 30 KeV, $5\times10^{13}$ cm$^{-2}$) are implanted.

Figure 5:
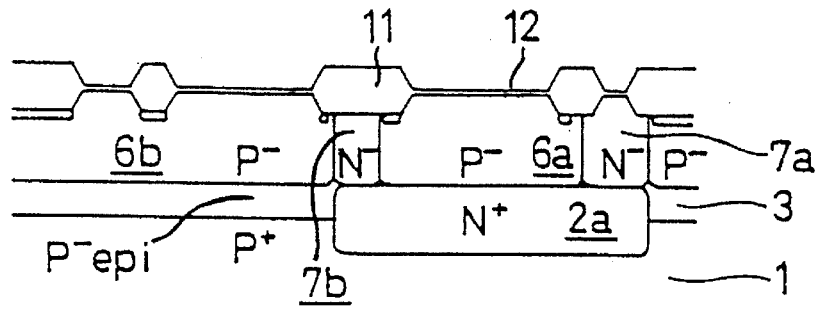
FIGS. 5 to 8 are a sectional view of a semiconductor device in each step of a second half of manufacturing process of Example 1 of the present invention.

As shown in FIG. 5, a field oxide film is formed with a thickness of 600 nm as a device isolation region 11 and a gate oxide film 12 is formed with a thickness of about 25 nm.

Figure 6:
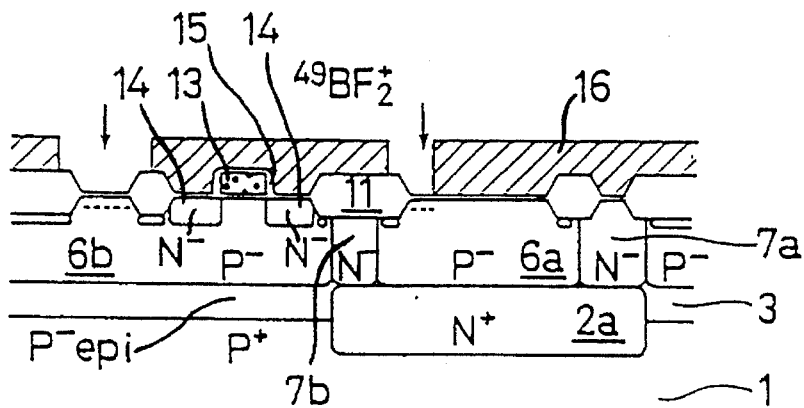

FIG. 6 shows that a gate electrode 13 of the MOS transistor is formed of N$^+$ polysilicon having a thickness of about 300 nm and an N$^-$ diffusion region 14 of LDD structure of N channel MOS is formed. A side wall spacer 15 is formed on the gate electrode 13. A mask 16 is formed with a desired shape by photolithographic process and ions ($^{49}BF_2^+$: 50 KeV, $5\times10^{15}$ cm$^{-2}$) are implanted for forming a base contact diffusion region of the electrostatic discharge protection device and a well contact diffusion region of N channel MOS.

Figure 7:
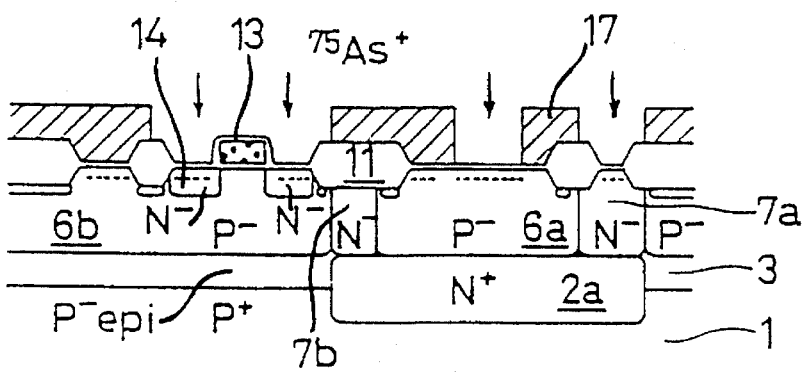

Next, as shown in FIG. 7, a mask 17 is formed with a desired shape by photolithographic process and ions ($^{75}As^+$: 80 KeV, $5\times10^{15}$ cm$^{-2}$) are implanted, thereby forming an emitter and collector contact diffusion region of the electrostatic discharge protection device and source/drain region (about $2\times10^{20}$ cm$^{-3}$) of N channel MOS.

Figure 8:
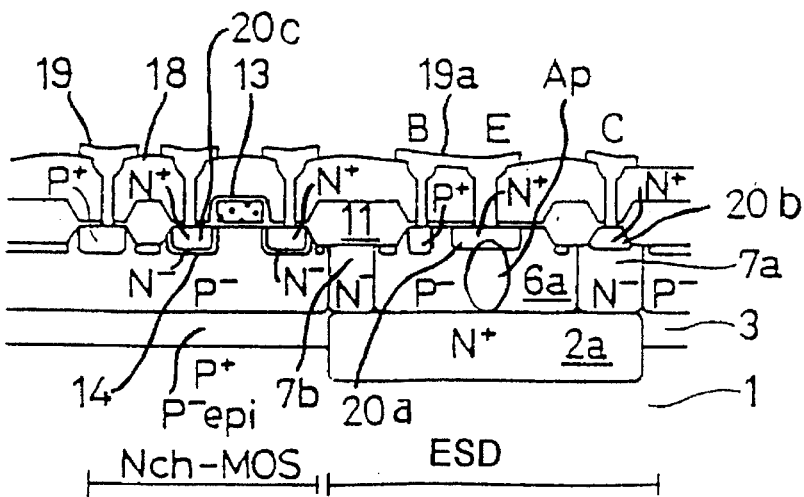

Further, as shown in FIG. 8, after forming an emitter 20a and collector contact diffusion region 20b of the electrostatic discharge protection device and source/drain region 20c of N channel MOS, an NSG/BPSG film 18 is formed with a thickness of 100/700 nm on the entire surface of the substrate 1, and a contact hole is formed through the NSG/BPSG film 18 provided on the emitter 20a, the collector contact diffusion region 20b, the base 6a and the source/drain region 20c. Then, a metal wiring 19 (Al—Si: 1.1 microns) is formed. The emitter and base of the electrostatic discharge protection device are shorted with a metal 19a.

Figure 9:
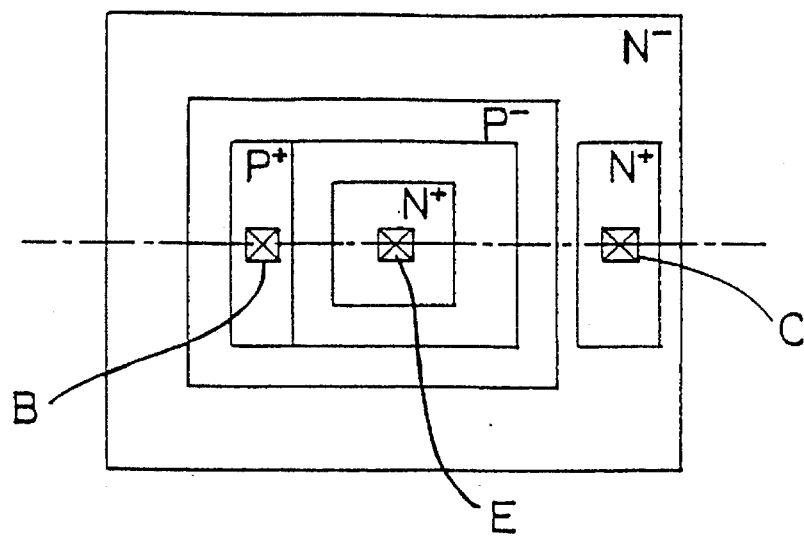
FIG. 9 is a plan view for showing an arrangement of a diffusion region in an electrostatic discharge protection device of Examples 1 and 2.
Figure 10:
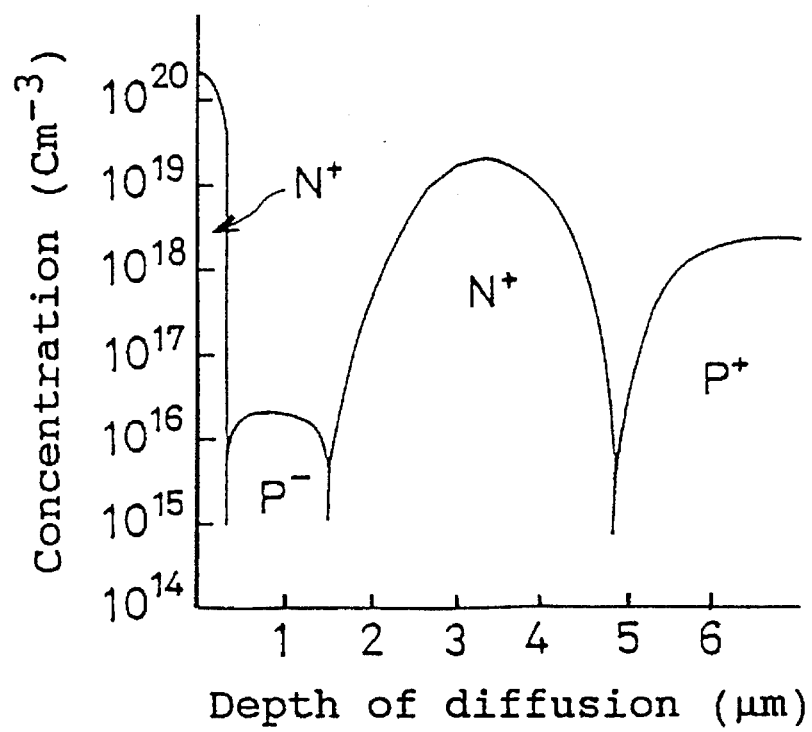
FIG. 10 is a graph showing a concentration profile beneath an emitter of an electrostatic discharge protection device of Examples 1, 2, 6 and 7.

FIG. 9 shows thus formed electrostatic discharge protection device in the semiconductor device and FIG. 10 shows a concentration profile beneath the emitter of the electrostatic discharge protection device.

When a reverse bias is applied to the collector of the bipolar transistor which works as electrostatic discharge protection device, punch-through occurs in the emitter and buried collector at about 10 V (shown as region Ap in FIG. 8), whereby an electric current starts flowing. If the reverse bias is further applied, transistor functions and snap-back occur at about 14 V. As a result, the collector voltage decreases, so that the electric current increases further as shown in FIG. 11.

FIG. 12 is an equivalent circuit showing a part of a semiconductor device comprising a vertical type bipolar transistor as the electrostatic discharge protection device described above. In this device, when electrostatics having a potential which is higher than $V_{DD}$ and does not cause breakdown on the GND side of the device occurs in $P_{ad}$, the electrostatics can escape from $P_{ad}$ to $V_{DD}$; and when electrostatics having a potential which is higher than $V_{DD}$ and causes breakdown on the GND side of the device occurs in Pad, the electrostatics flows to GND. On the other hand, when electrostatics having a potential which is lower than GND and does not cause breakdown on the $V_{DD}$ side of the device occurs in $P_{ad}$, the electrostatics can escape from GND to $P_{ad}$; and when electrostatics having a potential which is lower than GND and causes breakdown on the $V_{DD}$ side of the device occurs in $P_{ad}$, the electrostatics can escape from $V_{DD}$ to $P_{ad}$.

In this Example, both of the N$^+$ buried collector 2a and epitaxial layer 3 are employed, but the N$^+$ buried collector can be used by implanting with high energy without using epitaxial layer.

EXAMPLE 2

Example 2 relates to CMOS type semiconductor device comprising a vertical type bipolar transistor which causes snap-back triggered by punch-through.

Figure 13:
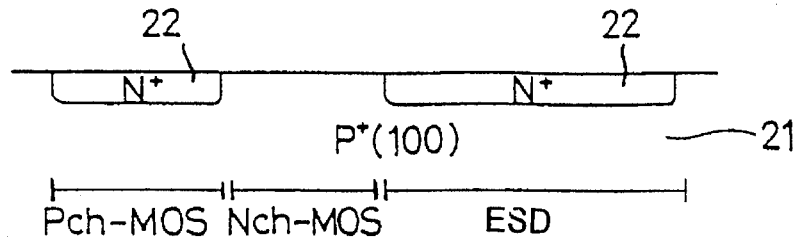
FIGS. 13 to 16 are a sectional view of a semiconductor device in each step of a first half of manufacturing process of Example 2.

As shown in FIG. 13, a P$^+$ type silicon substrate 21 is used. First, SOG is applied on the region for the electrostatic discharge protection device and P channel MOS on the substrate in the same manner as Example 1. Then, the substrate is subjected to thermal treatment in the same manner as Example 1, thereby forming an N$^+$ diffusion region 22.

Figure 14:
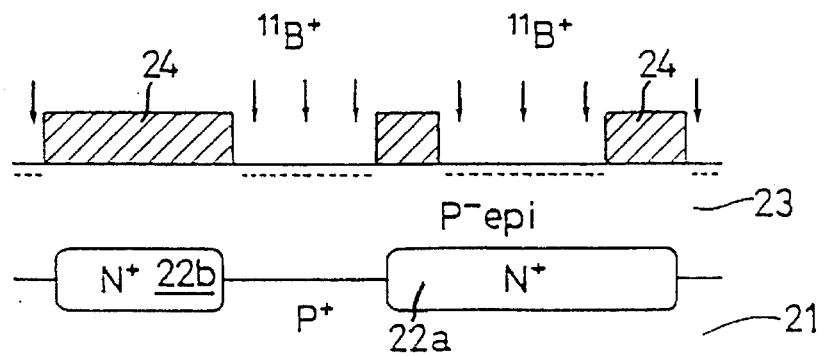

Subsequently, a P$^-$ epitaxial layer 23 is grown with a thickness of about 3.1 microns and a buried collector 22a is formed as shown in FIG. 14. Then, a mask 24 is formed with a desired shape and $^{11}B^+$ ions are implanted for obtaining a P$^-$ well having a relatively high resistivity which comprises a base region for the electrostatic discharge protection device and an N channel MOS formation region.

Figure 15:
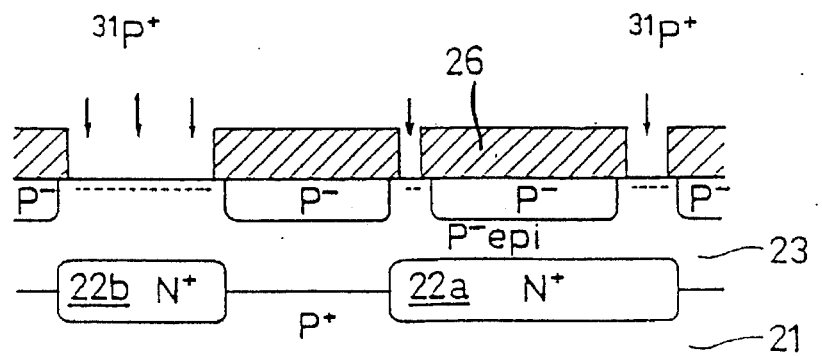

As shown in FIG. 15, a mask 26 is formed in the same manner as Example 1 and $^{31}P^+$ ions are implanted for forming a collector sinker region for electrostatic discharge protection device, collector region and N$^-$ well which is used for P channel MOS region.

Figure 16:
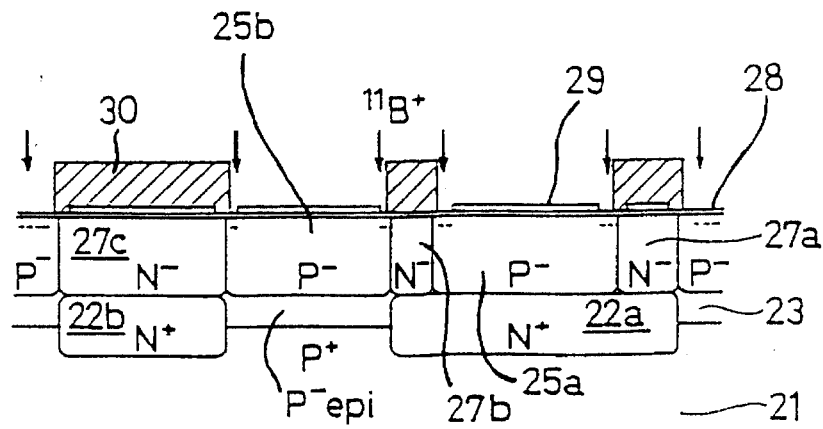

Then, as shown in FIG. 16, a P$^-$ well comprising a base 25a and a lightly doped well for N channel MOS transistor 25b, an N$^-$ well comprising a collector sinker region 27a, a collector 27b and a lightly doped well for P channel MOS transistor 27c are formed in the same manner as Example 1. In that case, the base 25a and lightly doped well of an N channel MOS transistor 25b which works as a P$^-$ well have a concentration of about $2\times10^{16}$ cm$^{-3}$ and a diffusion depth of about 1.5 microns. Further, an SiO$_2$ film 28 and a nitride film 29 are formed in the same manner as Example 1 and the nitride film 9 is etched to have a desired shape. In order to prevent the reverse of the P$^-$ well surfaces 25a and 25b, a mask 30 is formed and $^{11}B^+$ ions are implanted in the same manner as Example 1.

Figure 17:
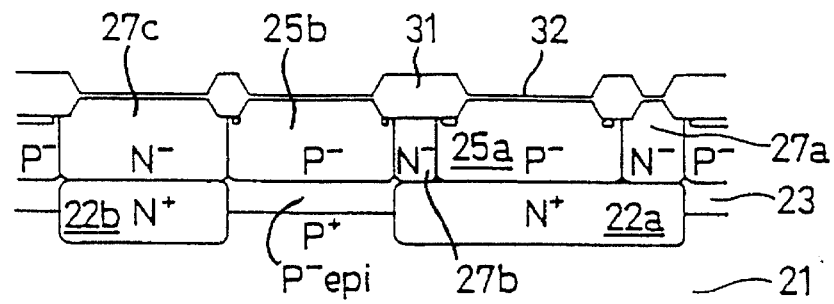
FIGS. 17 to 20 are a sectional view of a semiconductor device in each step of a second half of manufacturing process of Example 2.

Next, as shown in FIG. 17, a field oxide film is formed as a device isolation region 31 and a gate oxide film 32 is formed.

Figure 18:
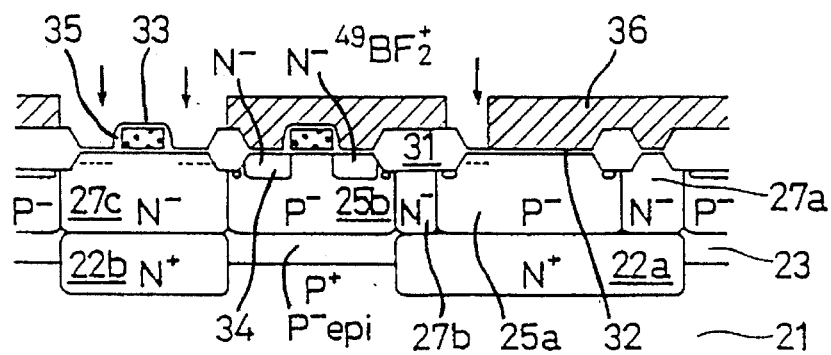

FIG. 18 shows that a gate electrode 33 of MOS transistor and an N$^-$ diffusion region 34 of N channel MOS having LDD structure are formed. Subsequently, a side wall spacer 35 is formed on the gate electrode 33. A mask 36 is formed and $^{49}BF_2^+$ ions are implanted for forming a base contact diffusion region of the electrostatic discharge protection device and a source/drain of P channel MOS in the same manner as Example 1.

Figure 19:
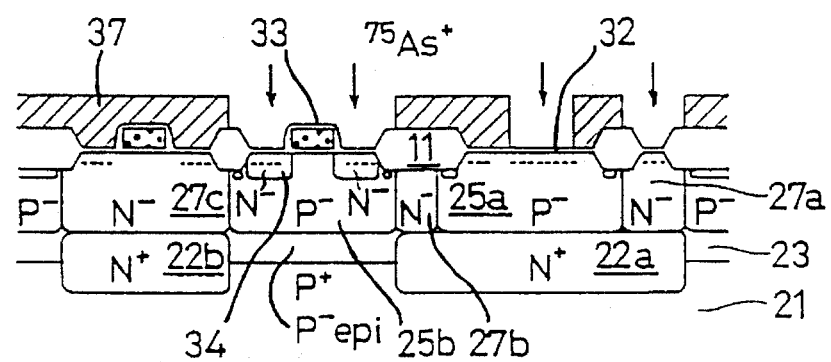

Next, as shown in FIG. 19, in order to form an emitter and a collector contact diffusion region in the electrostatic discharge protection device, and a source/drain region of N channel MOS (about $2\times10^{20}$ cm$^{-3}$), a mask 37 is formed and $^{75}As^+$ ions are implanted in the same manner as Example 1.

Figure 20:
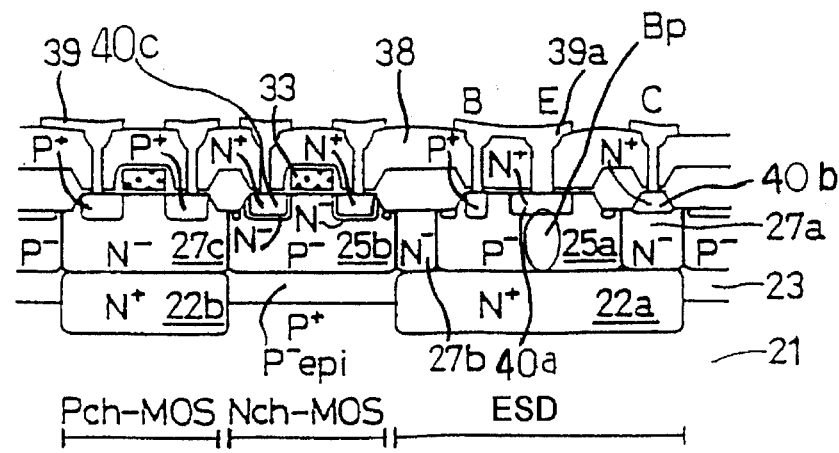

Further, as shown in FIG. 20, after forming an emitter 40a and collector contact diffusion region 40b of the electrostatic discharge protection device and source/drain region 40c of N channel MOS, an NSG/BPSG film 38 is formed on the whole surface of the semiconductor substrate 21 and a metal wiring 39 is formed in the same manner as Example 1. Then, the emitter and base of the electrostatic discharge protection device are connected with a metal 39a.

The plan view of thus formed electrostatic discharge protection device in the semiconductor device is the same as FIG. 9 and a concentration profile beneath the emitter of the electrostatic discharge protection device is the same as FIG.

10.

When a reverse bias is applied to the collector of the bipolar transistor of this type which works as the electrostatic discharge protection device, punch-through occurs in a region shown as a region Bp in FIG. 20, whereby an electric current starts flowing. If the reverse bias is further applied, transistor functions and snap-back occur at about 14 V. As a result, the collector voltage decreases, so that the electric current increases further as shown in FIG. 11.

FIG. 12 also shows an equivalent circuit of Example 2 showing a part of the semiconductor device comprising bipolar transistor of the electrostatic discharge protection device.

In this Example, both of the $N^+$ buried collector 22a and epitaxial layer 23 are employed, but $N^+$ buried collector can be also used by implanting with high energy without using epitaxial layer.

EXAMPLE 3

Example 3 relates to another CMOS type semiconductor device comprising a vertical type bipolar transistor as an electrostatic discharge protection device which causes snap-back triggered by punch-through.

As shown in FIG. 21, an $N^+$ type silicon substrate 41 (about $2 \times 10^{18}$ cm$^{-3}$) is used.

As shown in FIG. 22, an $N^-$ epitaxial layer 42 is grown with a thickness of about 3.1 microns on the substrate 41. A mask 43 is formed and $^{11}B^+$ ions are implanted in the same manner as Example 1 for obtaining a $P^-$ well having a relatively high resistivity which comprises a base region and N channel MOS of the electrostatic discharge protection device.

Subsequently, in order to form an $N^-$ well comprising a collector sinker region for electrostatic discharge protection device and a P channel MOS region, a mask 43 is formed and $^{31}P^+$ ions are implanted in the same manner as Example 1 as shown in FIG. 23.

Then, in the same manner as Example 1, the resulting substrate is subjected to thermal treatment and $^{11}B^+$ and $^{31}P^+$ are driven into desired regions, respectively, thereby forming a $P^-$ well comprising a base 44a and a lightly doped well of N channel MOS transistor 44b and an $N^-$ well comprising a collector sinker region 45a and a lightly doped well of P channel MOS transistor 45b as shown in FIG. 24. The ion concentration of $P^-$ well comprising the base 44a and lightly doped well of N channel MOS transistor 44b is about $2 \times 10^{16}$ cm$^{-3}$ and a diffusion depth thereof is about 1.5 microns. Further, an $SiO_2$ film 26 and nitride film 27 are formed in the same manner as Example 1. After etching the films to give a desired shape, $^{11}B^+$ ions are implanted in the same manner of Example 1 for preventing the reverse of the $P^-$ well surface.

Figure 25:
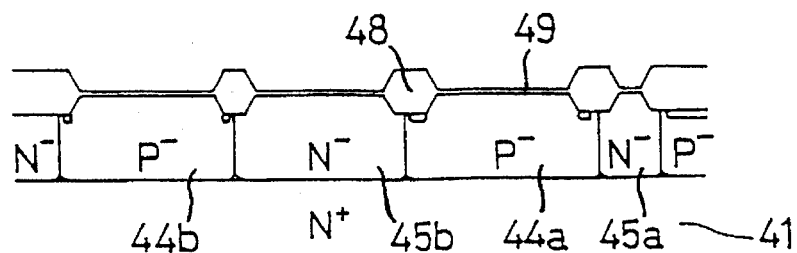
FIGS. 25 to 28 are a sectional view of a semiconductor device in each step of a second half of manufacturing process of Example 3.

Next, as shown in FIG. 25, a field oxide film is formed as a device isolation region 48. Further, a gate oxide film 49 is formed thereon.

Figure 26:
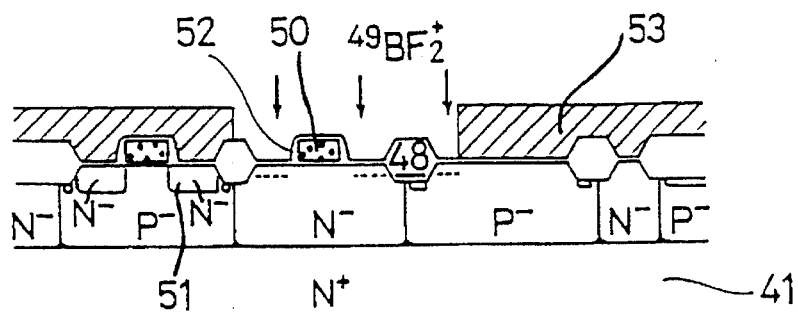

As shown in FIG. 26, a gate electrode 50 of MOS transistor and an $N^-$ diffusion region 51 of N channel MOS having LDD structure are formed. Subsequently, after forming a side wall spacer 52 on the gate electrode 50, a mask 53 is formed and $^{49}BF_2^+$ ions are implanted the same manner as Example 1 for forming a base contact diffusion region of the electrostatic discharge protection device and a source/drain of P channel MOS.

Figure 27:
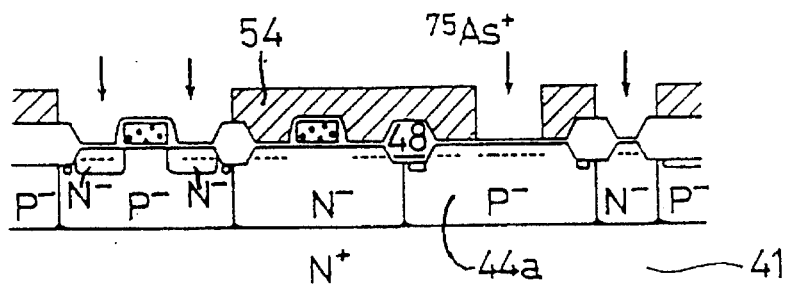

As shown in FIG. 27, a mask 54 is formed and $^{75}As^+$ ions are implanted in the same manner as Example 1 for forming an emitter and collector contact diffusion region of the electrostatic discharge protection device and source/drain region of N channel MOS.

Figure 28:
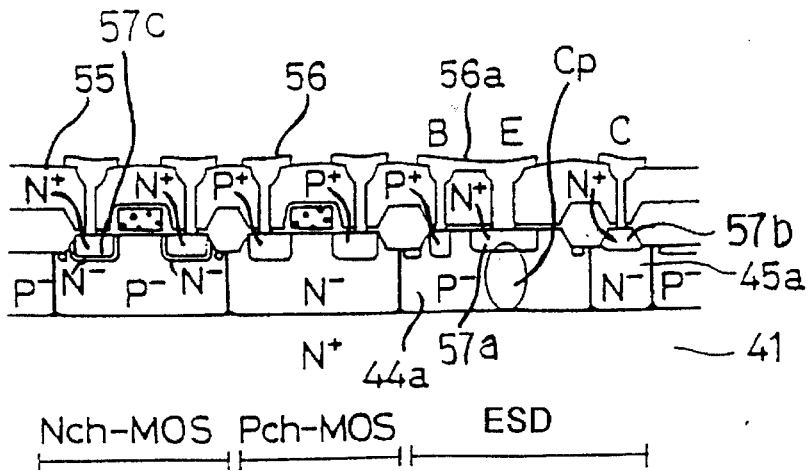

Further, as shown in FIG. 28, after forming an emitter 57a and collector contact diffusion region 57b of the electrostatic discharge protection device and source/drain region 57c of N channel MOS, an NSG/BPSG film 55 and a metal wiring 56 are formed on the whole surface of the semiconductor substrate 41 in the same manner as Example 1. Then, the emitter and base of the electrostatic discharge protection device are shorted with a metal 56a.

FIG. 29 shows a plan view of thus formed electrostatic discharge protection device in the semiconductor device and FIG. 30 shows a concentration profile beneath the emitter of the electrostatic discharge protection device.

When a reverse bias is applied to the collector of the bipolar transistor of this type which works as the electrostatic discharge protection device, punch-through occurs in a region shown as Cp in FIG. 28, whereby an electric current starts flowing. If the reverse bias is further applied, transistor functions and snap-back occur at about 14 V. As a result, the collector voltage decreases, so that the electric current increases further as shown in FIG. 11.

FIG. 12 also shows an equivalent circuit of Example 3 showing a part of the semiconductor device comprising bipolar transistor which works as an electrostatic discharge protection device. However, since the whole surface of the $N^+$ substrate is used as the collector in the present example, the $N^+$ substrate becomes $V_{DD}$ and works as a protection device only for the $V_{DD}$ side (upper side) in FIG. 12. Therefore, another protection device is required for GND side. In that case, it is not necessary to have an $N^-$ well (collector), $N^+$ collector contact diffusion region and metal wiring (collector) of the electrostatic discharge protection device of Example 3. If the polarity of the electrostatic discharge protection device is opposite to the present example, the $P^+$ substrate is used and grounded, and it works as a protection device only for the GND side.

EXAMPLE 4

Example 4 relates to a bipolar type semiconductor device comprising a bipolar transistor as an electrostatic discharge protection device which causes snap-back triggered by punch-through.

Figure 31:
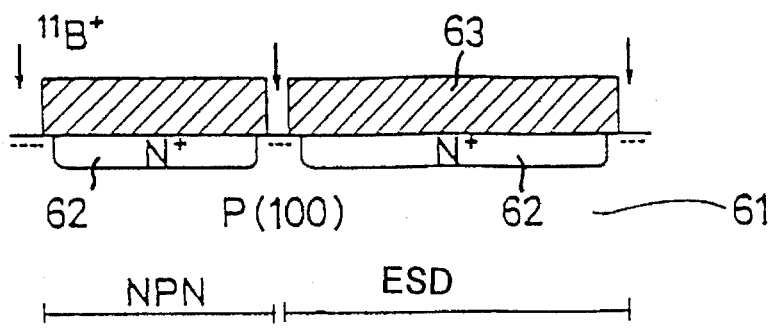
FIGS. 31 to 34 are a sectional view of a semiconductor device in each step of a first half of manufacturing process of Example 4.

As shown in FIG. 31, a P type silicon substrate 61 is used. Firstly, $N^+$ diffusion regions 62 are formed in the respective $N^+$ buried collector formation regions of NPN transistors, one of which works as an electrostatic discharge protection device and the other as a general NPN transistor, in the same manner as Example 1. Then, $^{11}B^+$ ions are implanted in a device isolation region.

Figure 32:
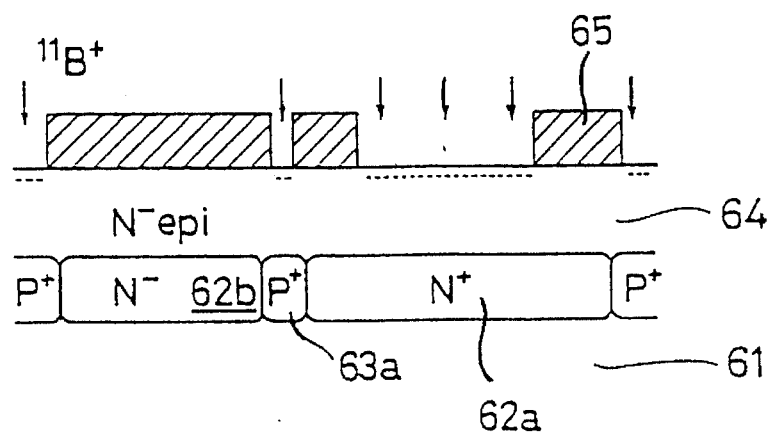

As shown in FIG. 32, an $N^-$ epitaxial layer 64 is grown with a thickness of about 3.1 microns and a buried collector 62a of the electrostatic discharge protection device, buried collector 62b of the NPN transistor for general use and $P^+$ buried layer 63a are formed. Then, a mask 65 is formed and $^{11}B^+$ ions are implanted in the same manner as Example 1 for obtaining a $P^-$ well having a relatively high resistivity which comprises a base region and device isolation region.

Figure 33:
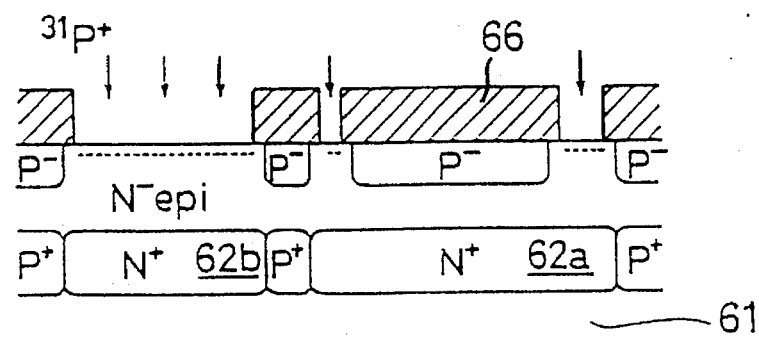

As shown in FIG. 33, a mask 66 is formed and $^{31}P^+$ ions are implanted in the same manner as Example 1 for forming a collector sinker region of the electrostatic discharge protection device and an $N^-$ well which works as a collector of the electrostatic discharge protection device and NPN transistor.

Figure 34:
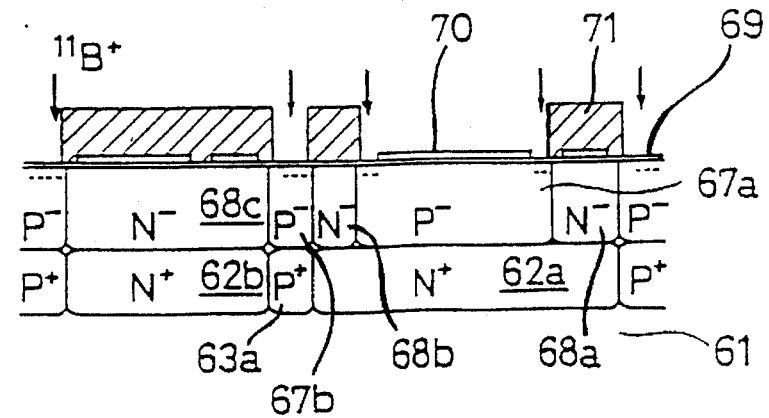

In the same manner as Example 1, the resulting substrate is subjected to thermal treatment and $^{11}B^+$ and $^{31}P^+$ are driven in a desired region, respectively, whereby a $P^-$ well comprising a base 67a of the electrostatic discharge protection device and a lightly doped well 67b for device isolation and an $N^-$ well comprising a collector sinker region 68a, a collector region 68b and a collector region 68c of NPN transistor are formed as shown in FIG. 34. In that case, the concentration of the $P^-$ well comprising the base 67a and the lightly doped well 67b for device isolation 67b is about $2\times10^{16}$ cm$^{-3}$ and a diffusion depth thereof is about 1.5 microns. Further, in the same manner as Example 1, an SiO$_2$ film 69 and nitride film 70 are formed and the nitride film 70 is etched to have a desired shape. In order to prevent the reverse of the $P^-$ well surface, a mask 71 is formed and $^{11}B^+$ ions are implanted in the same manner as Example 1.

Figure 35:
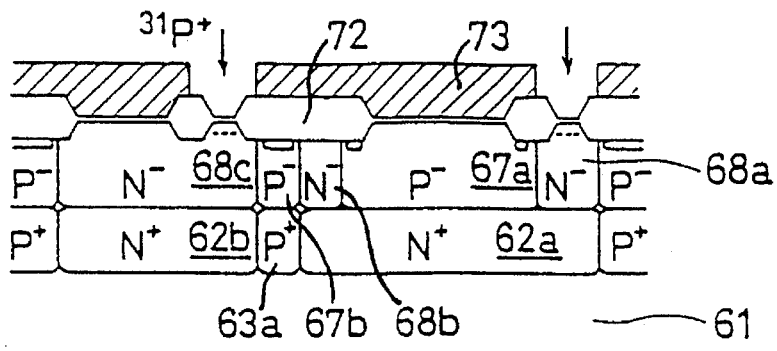
FIGS. 35 to 38 are a sectional view of a semiconductor device in each step of a second half of manufacturing process of Example 4.

Next, as shown in FIG. 35, after forming a field oxide film as a device isolation region 72, a mask 73 is formed with a desire shape by photolithographic process in the same manner as Example 1. Then, $^{31}P^+$ ions are implanted for forming an $N^+$ plug diffusion region (about $3\times10^{19}$ cm$^{-3}$) in the collector region of the electrostatic discharge protection device and NPN transistor (100 KeV, $1\times10^{15}$ cm$^{-2}$).

Figure 36:
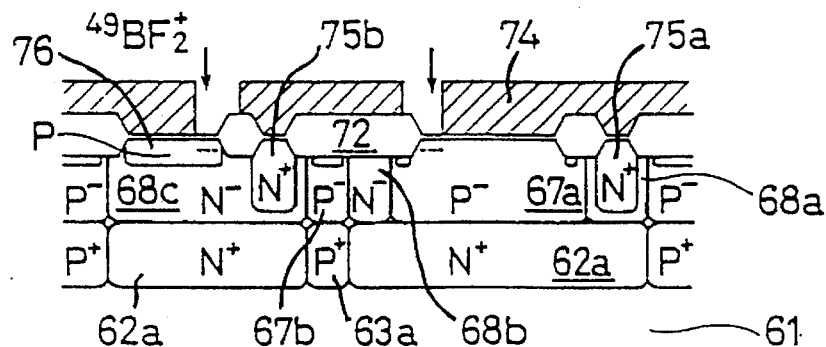

Next, as shown in FIG. 36 after forming a $N^+$ plug diffusion region 75a of the electrostatic discharge protection device and $N^+$ plug diffusion region 75b of NPN transistor, an active base 76 of NPN transistor is formed. Then, a mask 74 is formed by photolithographic process with a desired shape and $^{49}BF_2^{2+}$ ions are implanted (50 KeV, $5\times10^{15}$ cm$^{-2}$) for forming a base contact diffusion region of the electrostatic discharge protection device and NPN transistor.

Figure 37:
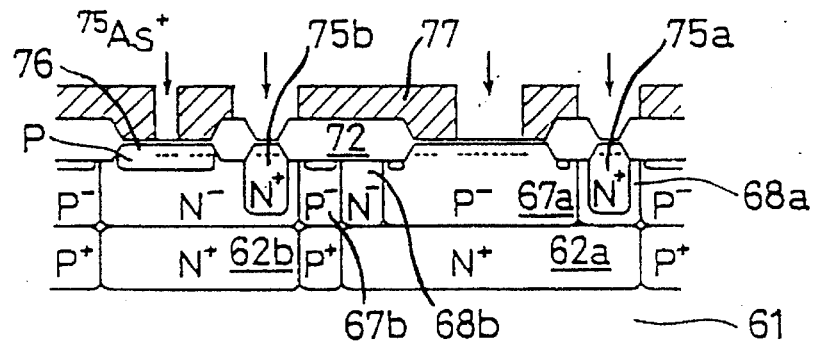

Further, as shown in FIG. 37, a mask 77 is formed with a desired shape by photolithographic process and $^{75}As^+$ ions are implanted (80 KeV, $5\times10^{15}$ cm$^{-2}$) for forming an emitter and collector contact diffusion region ($2\times10^{20}$ cm$^{-3}$) of the electrostatic discharge protection device and NPN transistor.

Figure 38:
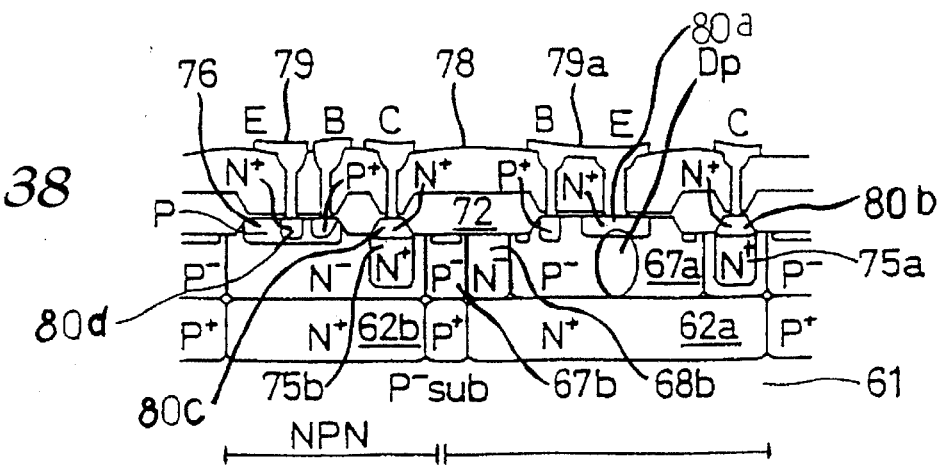

Subsequently, as shown in FIG. 38 after forming an emitter 80a of the electrostatic discharge protection device, an emitter 80d of the NPN transistor, a collector contact diffusion region 80b of the electrostatic discharge protection device and a collector contact diffusion region 80c of NPN transistor, an NSG/BPSG film 78 is formed on the surface of a semiconductor substrate 61 in the same manner of Example 1 and a metal wiring 79 is formed. In that case, the emitter and base of the electrostatic discharge protection device are shorted with a metal 79a.

FIG. 39 shows a plan view of thus formed electrostatic discharge protection device in the semiconductor device and FIG. 40 shows a concentration profile beneath the emitter of the electrostatic discharge protection device.

When a reverse bias is applied to the collector of the bipolar transistor of this type which works as the electrostatic discharge protection device, punch-through occurs in a region shown as region Dp in FIG. 38, whereby an electric current starts flowing. If the reverse bias is further applied, transistor function and snap-back occur at about 14 V. As a result, the collector voltage decreases, so that the electric current increases further as shown in FIG. 11.

FIG. 12 also shows an equivalent circuit of Example 4 showing a part of the semiconductor device comprising bipolar transistor working as the electrostatic discharge protection device.

EXAMPLE 5

Example 5 relates to BiCMOS type semiconductor device comprising a bipolar transistor as an electrostatic discharge protection device which causes snap-back triggered by punch-through.

Figure 41:
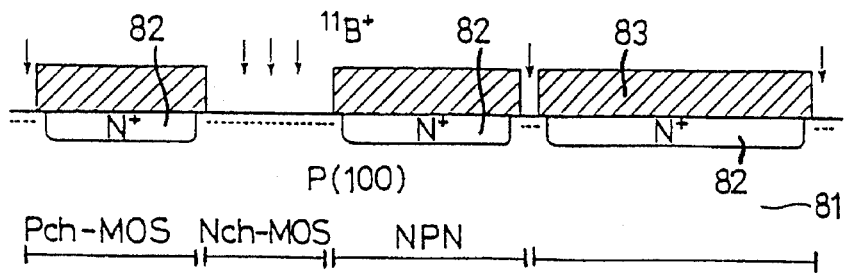
FIGS. 41 to 44 are a sectional view of a semiconductor device in each step of a first half of manufacturing process of Example 5.

An $N^+$ diffusion region 82 is formed in a region where the electrostatic discharge protection device, $N^+$ buried collector region of NPN transistor for general use and P channel MOS are formed on a P type silicon substrate 81, respectively as shown in FIG. 41 in the same manner of Example 01. Subsequently, $^{11}B^+$ ions are implanted (50 KeV, $1\times10^{14}$ cm$^{-2}$) into an N channel MOS and device isolation by using a resist 83 as a mask for obtaining a $P^+$ buried diffusion region.

Figure 42:
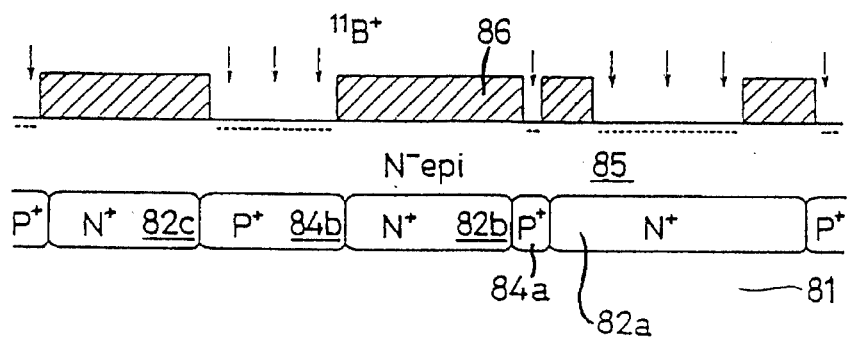

Next, as shown in FIG. 42, an $N^-$ epitaxial layer 85 is grown with a thickness of about 3.1 micron, a buried collector 82a of the electrostatic discharge protection device and a buried collector 82b of NPN transistor are formed. Next, a mask 86 is formed and $^{11}B^+$ ions are implanted for forming a $P^-$ well having a relatively high resistivity which comprise a base region, N channel MOS and device isolation region of the electrostatic discharge protection device in the same manner as Example 1.

Figure 43:
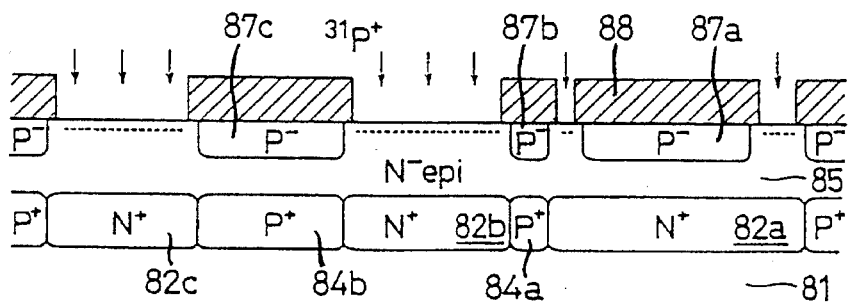

Subsequently, as shown in FIG. 43, a mask 88 is formed and $^{31}p^+$ ions are implanted to obtain a base of the electrostatic discharge protection device and NPN transistor and an $N^-$ well of P channel MOS region in the same manner as Example 1.

Figure 44:
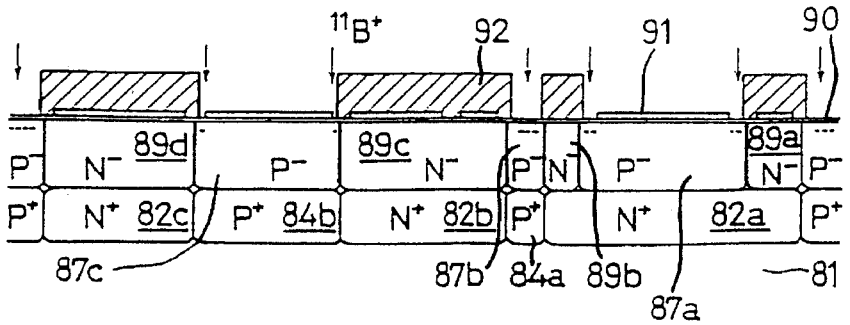

As shown in FIG. 44, the substrate is subjected to thermal treatment in the same manner of Example 1 and $^{11}B^+$ and $^{31}P^+$ ions are driven in the desired region, respectively, whereby a $P^-$ well comprising a base 87a, lightly doped well for device isolation 87b, lightly doped well for N channel MOS transistor 87c and $N^-$ well comprising a collector sinker region 89a, collector region 89b, collector for NPN 89c and lightly doped well for P channel MOS transistor 89d. In that case, the concentration of the base 87a and lightly doped well for device isolation 87b and N channel MOS transistor 87c which work as a $P^-$ well is about $2\times10^{16}$ cm$^{-3}$ and a diffusion depth thereof is about 1.5 microns. Further, an SiO$_2$ film 90 and a nitride film 91 are formed and etched in the same manner as Example 1. Then, in order to prevent the reverse of the $P^-$ well surface, a mask 92 is formed and $^{11}B^+$ ions are implanted in the same manner as Example 1.

Figure 45:
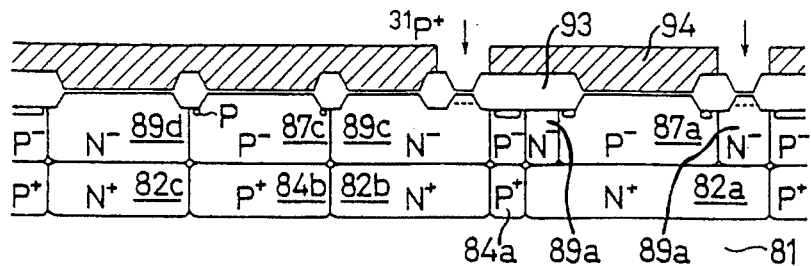
FIGS. 45 to 48 are a sectional view of a semiconductor device in each step of a second half of manufacturing process of Example 5.

Next, as shown in FIG. 45, after forming a field oxide film as a device isolation region 93, a mask 94 is formed with a desired shape by photolithographic process and $^{31}P^+$ ions are implanted (100 KeV, $1\times10^{15}$ cm$^{-2}$) for forming an $N^+$ plug diffusion region ($3\times10^{19}$ cm$^{-3}$) in collector region of the electrostatic discharge protection device and NPN transistor.

Figure 46:
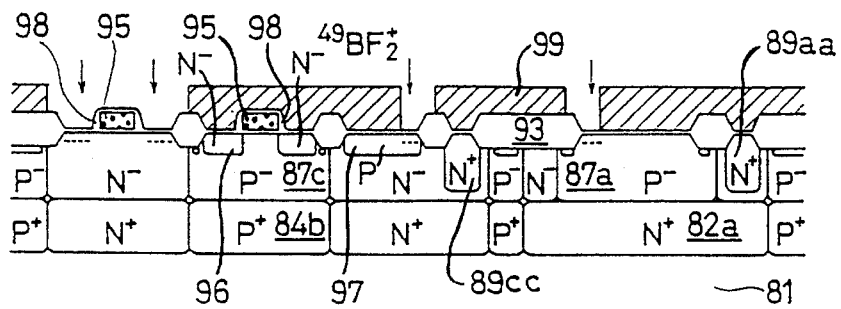

As shown in FIG. 46, after forming a plug diffusion region 89aa of the electrostatic discharge protection device and a plug diffusion region 89cc of NPN transistor, a gate electrode 95 of MOS transistor is formed. Further, an $N^-$ diffusion region 96 of N channel MOS having LDD structure and an active base 97 of NPN transistor are formed, and then, a side wall spacer is formed on the gate electrode 95. Subsequently, a mask 99 is formed with a desired shape by photolithographic process and $^{49}BF_2^+$ ions are implanted (50 KeV, $5\times10^{15}$ cm$^{-2}$) for forming a base contact diffusion region of the electrostatic discharge protection device and NPN transistor and a source/drain of P channel MOS.

Figure 47:
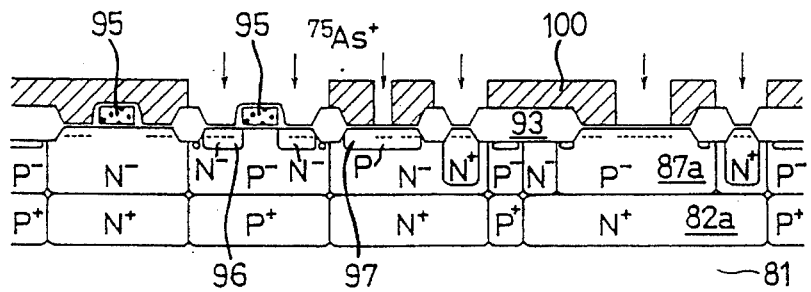

Next, as shown in FIG. 47, a mask 100 is formed with a desired shape by photolithographic process and $^{75}As^+$ ions are implanted (about $2\times10^{20}$ cm$^{-3}$, 80 KeV, $5\times10^{15}$ cm$^{-2}$) for forming an emitter and a collector contact diffusion region in the electrostatic discharge protection device and NPN transistor, and a source/drain region of N channel

MOS.

Figure 48:
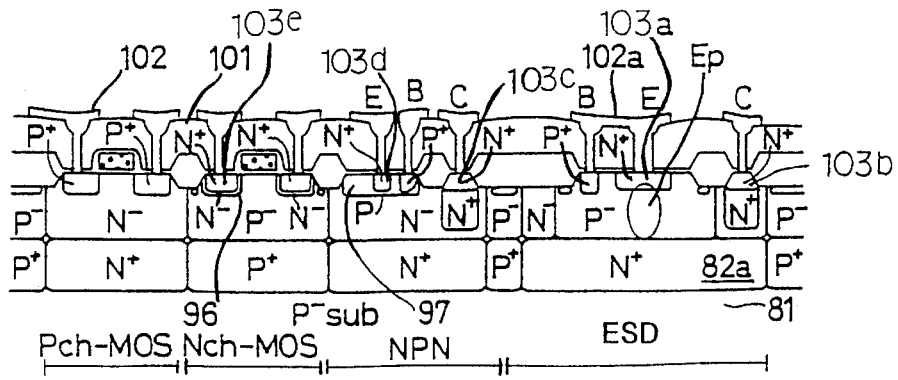

Further, as shown in FIG. 48, after forming an emitter 103a of the electrostatic discharge protection device, emitter 103d of NPN transistor, collector contact diffusion region 103b of the electrostatic discharge protection device, collector contact diffusion region 103c for NPN transistor and source/drain region 103e of N channel MOS, an NSG/BPSG film 101 and metal wiring 102 are formed on the surface of the semiconductor substrate 81 in the same manner as Example 1. Then, the emitter and base of the electrostatic discharge protection device are shorted with a metal 102a.

FIG. 39 shows a plan view of thus formed electrostatic discharge protection device in the semiconductor device and FIG. 40 shows a concentration profile beneath the emitter of the electrostatic discharge protection device.

When a reverse bias is applied to the collector of the bipolar transistor of this type which works as the electrostatic discharge protection device, punch-through occurs in a region shown as region Ep in FIG. 48, whereby an electric current starts flowing. If the reverse bias is further applied, transistor function and snap-back occur at about 14 V. As a result, the collector voltage decreases, so that the electric current increases further as shown in FIG. 11.

FIG. 12 also shows an equivalent circuit of Example 5 showing a part of the semiconductor device comprising bipolar transistor of the electrostatic discharge protection device.

EXAMPLE 6

Example 6 relates to MOS type semiconductor device comprising a vertical type bipolar transistor as an electrostatic discharge protection device which causes snap-back triggered by an avalanche breakdown that can compensate high punch-through breakdown voltage caused by a variety of thickness of the epitaxial layer in the manufacturing process.

Figure 49:
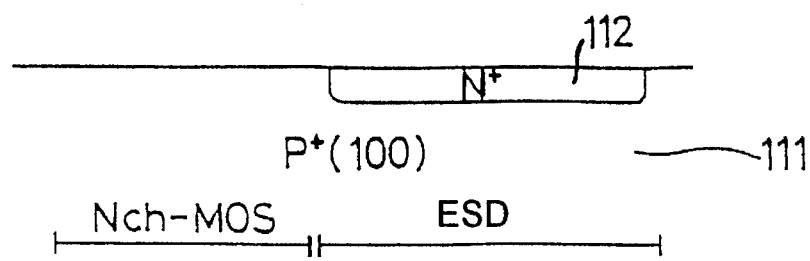
FIGS. 49 to 52 are a sectional view of a semiconductor device in each step of a first half of manufacturing process of Example 6.

An $N^+$ diffusion region 112 is formed in an $N^+$ buried collector formation region of the electrostatic discharge protection device on a p type silicon substrate 111 in the same manner as Example 1 as shown in FIG. 49.

Figure 50:
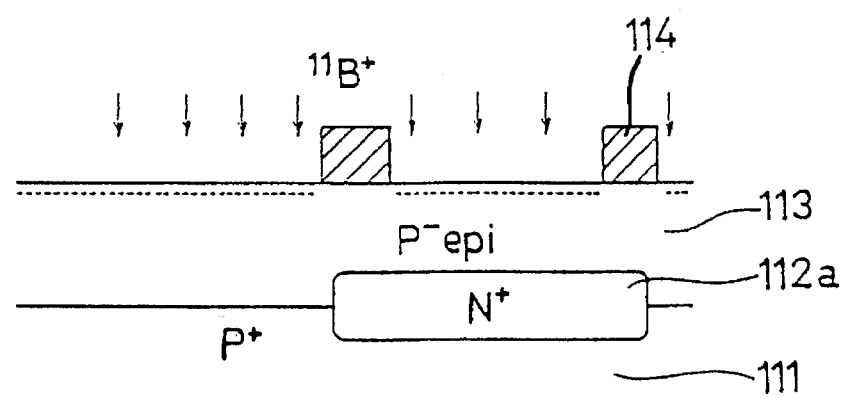

As shown in FIG. 50, a $P^-$ epitaxial layer 113 is grown with a thickness of about 3.1 micron, an $N^+$ buried collector 112a of the electrostatic discharge protection device are formed in the same manner as Example 1. Next, $^{11}B^+$ ions are implanted by using a mask 114 for forming a $P^-$ well having a relatively high resistivity comprising a base region of the electrostatic discharge protection device and N channel MOS in the same manner as Example 1.

Figure 51:
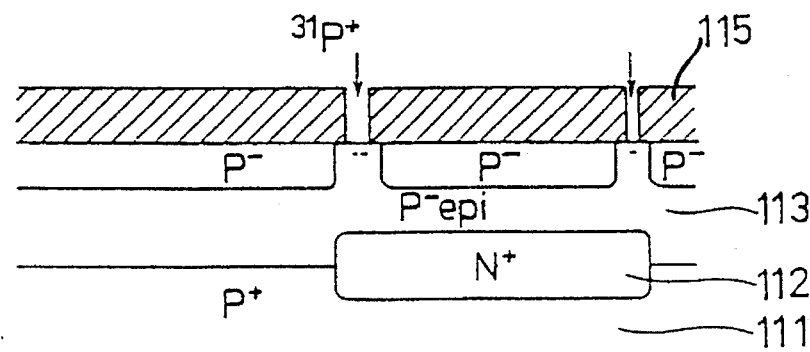

Subsequently, as shown in FIG. 51, $^{31}P^+$ ions are implanted to obtain an $N^-$ well which works as a collector sinker region of an electrostatic discharge protection device by using a mask 115 in the manner as Example 1.

Figure 52:
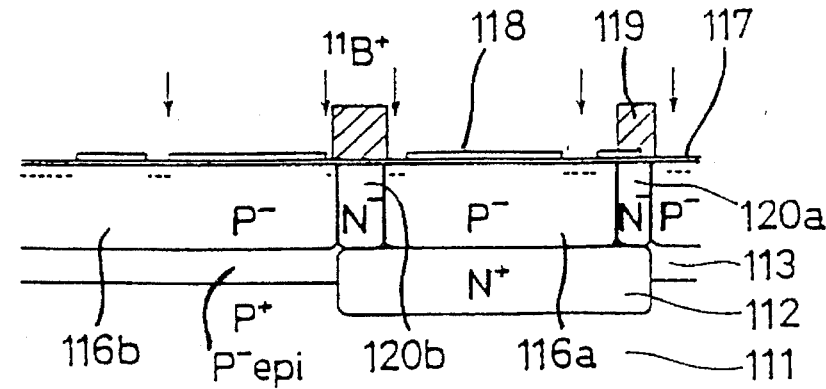

As shown in FIG. 52, the substrate is subjected to thermal treatment in the same manner of Example 1 and a $P^-$ well comprising a base 116a, lightly doped well for N channel transistor formation 116b and $N^-$ well comprising a collector sinker region 120a and collector region 120b are formed. In that case, the concentration of the base 116a and lightly doped well for forming an N channel transistor 116b which work as a $P^-$ well is about $2\times10^{16}$ cm$^{-3}$ and a diffusion depth thereof is about 1.5 microns. Further, an $SiO_2$ film 117 and a nitride film 118 are formed and etched to have a desired shape in the same manner as Example 1. Then, in order to prevent the reverse of the $P^-$ well surface and to control avalanche breakdown between the $N^+$ type collector contact diffusion region and $P^-$ base of the electrostatic discharge protection device, a mask 119 is formed with a desired shape by photolithographic process and $^{11}B^+$ ions are implanted (30 KeV, $5\times10^{13}$ cm$^{-2}$) in the same manner as Example 1.

Figure 53:
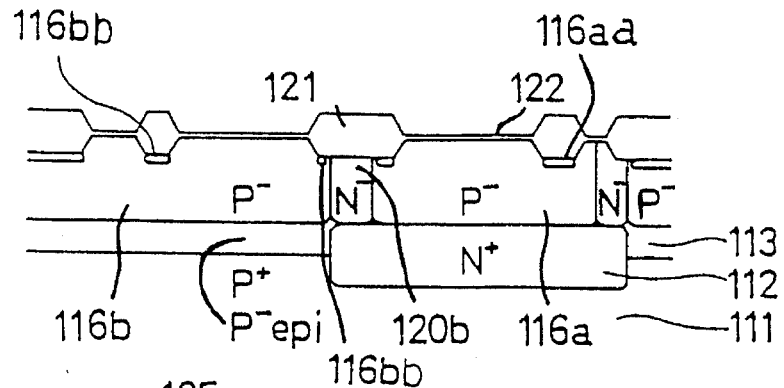
FIGS. 53 to 56 are a sectional view of a semiconductor device in each step of a second half of manufacturing process of Example 6.

Next, as shown in FIG. 53, after forming a highly doped regions 116aa and 116bb for controlling avalanche breakdown voltage between an $N^+$ collector contact diffusion region and $P^-$ base of the electrostatic discharge protection device and for preventing the reverse of the surface of the $P^-$ well, a field oxide film as a device isolation region 121 and a gate oxide film 122 are formed. In that case, the concentration of the highly doped region 116aa is about $1\times10^{17}$ cm$^{-3}$. The highly doped region 116aa is formed so as to locate under the device isolation region 121 and contact with a collector contact diffusion region to be formed in the following step.

Figure 54:
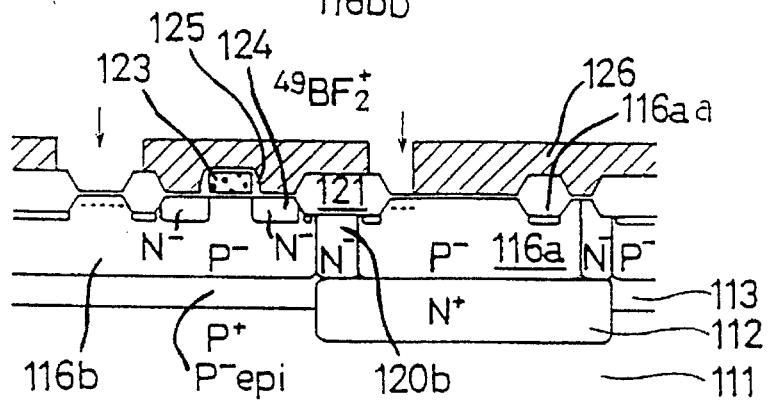

As shown in FIG. 54, a gate electrode 123 of the MOS transistor, an $N^-$ diffusion region 124 of N channel MOS having LDD structure and a side wall spacer 125 are formed. Subsequently, $^{49}BF_2^+$ ions are implanted by using a mask 126 for forming a base contact diffusion region of the electrostatic discharge protection device and a contact diffusion of N channel MOS.

Figure 55:
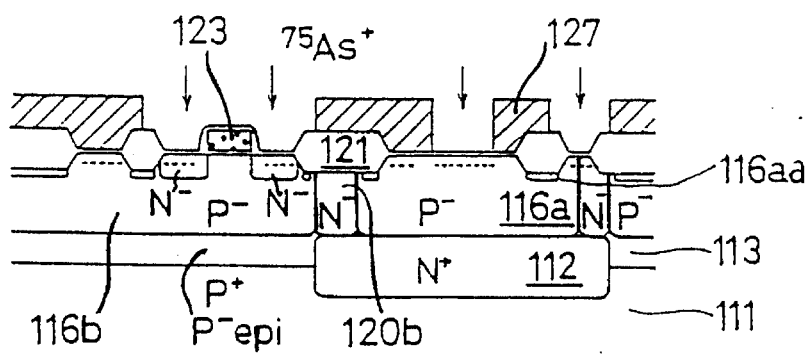

Next, as shown in FIG. 55, $^{75}As^+$ ions are implanted (about $2\times10^{20}$ cm$^{-3}$) by using a mask 127 in the same manner as Example 1 for forming an emitter and a collector contact diffusion region in the electrostatic discharge protection device and a source/drain region of N channel MOS.

Figure 56:
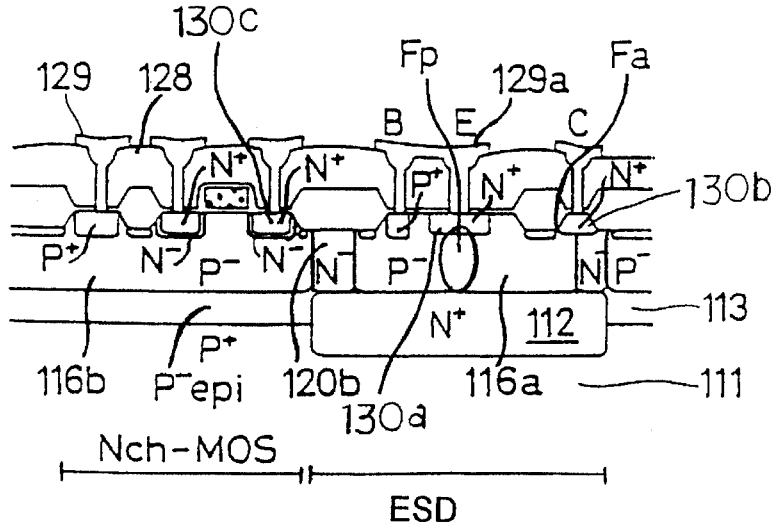

Further, as shown in FIG. 56, after forming an emitter 130a of the electrostatic discharge protection device, collector contact diffusion region 130b connected with a highly doped diffusion region 116aa and source/drain region 130c of N channel MOS, an NSG/BPSG film 128 and metal wiring 129 are formed on the surface of the semiconductor substrate 111. Then, the emitter and base of the electrostatic discharge protection device are shorted with a metal 129a.

Figure 57:
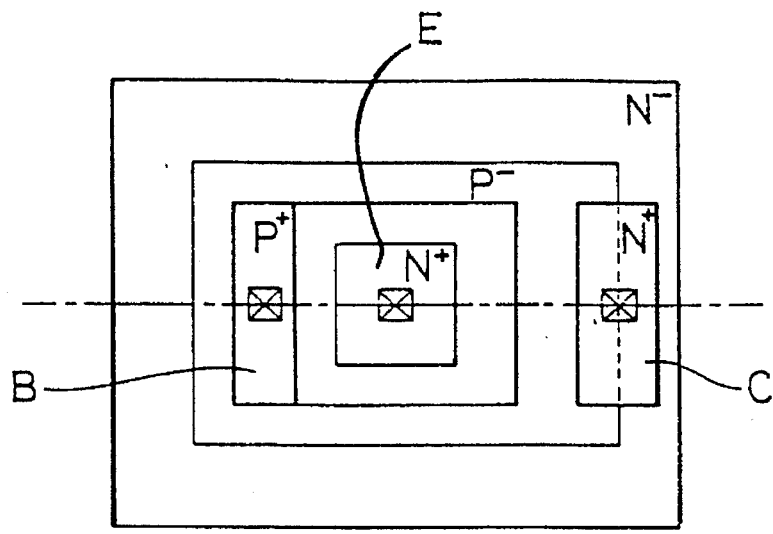
FIG. 57 is a plan view showing an arrangement of a diffusion region of an electrostatic discharge protection device of Examples 6 and 7.

FIG. 57 shows a plan view of thus formed electrostatic discharge protection device in the semiconductor device and FIG. 10 shows a concentration profile beneath the emitter of the electrostatic discharge protection device.

When a reverse bias is applied to the collector of the bipolar transistor of this type used for the electrostatic discharge protection device in which the epitaxial layer has a desired thickness or less, punch-through occurs in a region shown as region Fp in FIG. 56, whereby an electric current starts flowing. If the reverse bias is further applied, transistor function and snap-back occur, whereby the electric current increases further.

Figure 58:
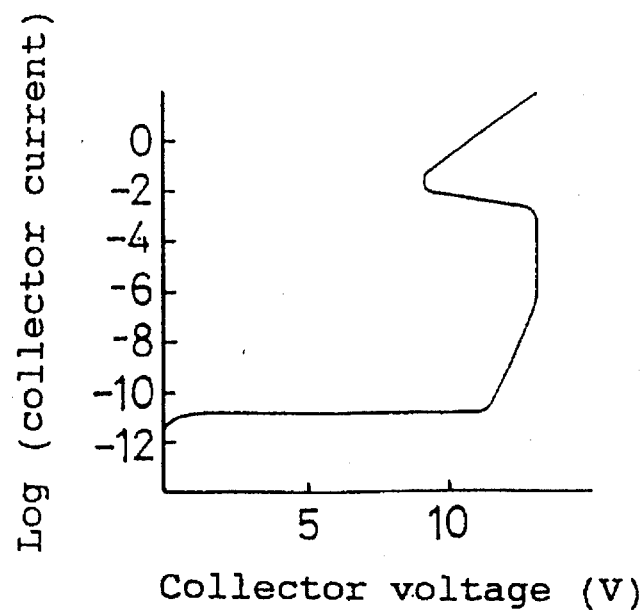
FIG. 58 is a graph showing a concentration profile beneath an emitter of an electrostatic discharge protection device of Examples 6 to 10.

If the thickness of the epitaxial layer is bounded to a thickness thicker than the desired thickness, the punch-through breakdown voltage is shifted to a higher voltage. Accordingly, the avalanche breakdown occurs at about 14 V in the base ($P^-$) and the horizontal collector ($N^+$) before snap-back occurs triggered by punch-through (shown as region Fa in FIG. 56). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 6 showing a part of the semiconductor device comprising bipolar transistor of the electrostatic discharge protection device.

The electrostatic discharge protection device of the present example does not comprise a plug diffusion region, but the plug diffusion region may be formed in an additional step. Further, both of the N⁺ buried diffusion region and epitaxial layer are formed in the present example, but N⁺ buried diffusion region may be also formed without providing an epitaxial layer by implanting high energy.

EXAMPLE 7

Example 7 relates to CMOS type semiconductor device comprising a vertical type bipolar transistor as an electrostatic discharge protection device which causes snap-back triggered by an avalanche breakdown that can compensate high punch-through breakdown voltage caused by a variety of thickness of the epitaxial layer in the manufacturing process.

Figure 59:
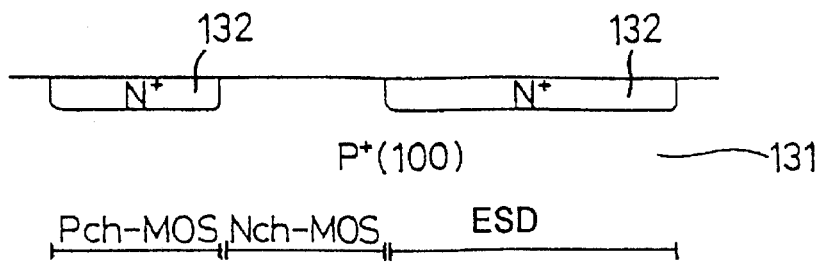
FIGS. 59 to 62 are a sectional view of a semiconductor device in each step of a first half of manufacturing process of Example 7.

An N⁺ diffusion region 132 is formed in an N⁺ buried collector formation region of the electrostatic discharge protection device and P channel MOS formation region on a P type silicon substrate 131 in the same manner as Example 1 as shown in FIG. 59.

Figure 60:
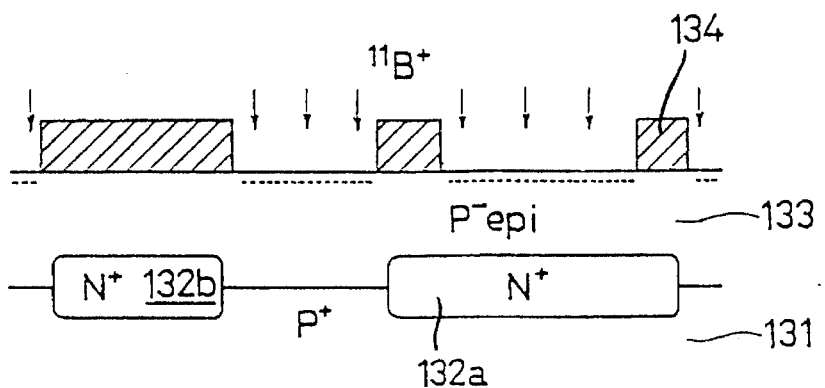

As shown in FIG. 60, an N⁻ epitaxial layer 133 is grown with a thickness of about 3.1 micron, an N⁺ buried collector 132a of the electrostatic discharge protection device are formed in the same manner as Example 1. Next, $^{11}B^+$ ions are implanted by using a mask 134 for forming a P⁻ well having a relatively high resistivity which is used for a base region of the electrostatic discharge protection device and N channel MOS in the same manner as Example 1.

Figure 61:
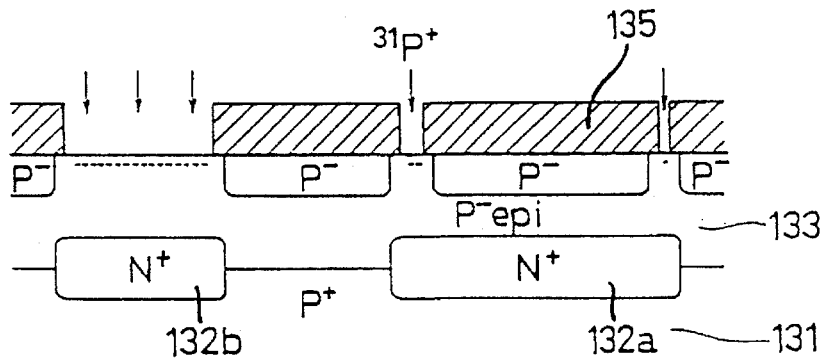

Subsequently, as shown in FIG. 61, $^{31}P^+$ ions are implanted to obtain an N⁻ well which works as a collector region of the electrostatic discharge protection device and P channel MOS region by using a mask 135 in the manner as Example 1.

Figure 62:
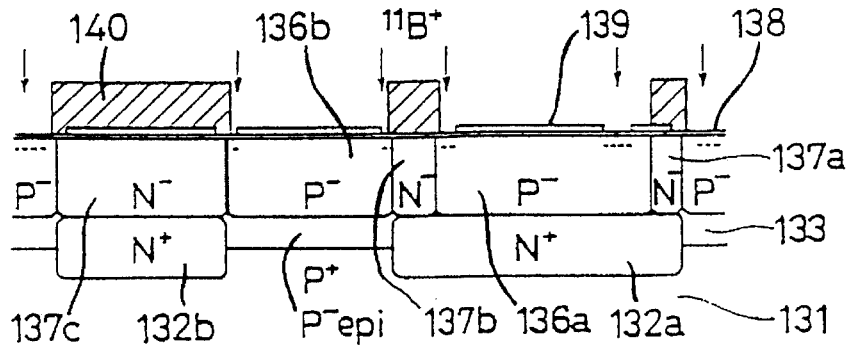

As shown in FIG. 62, a P⁻ well comprising a base 136a, lightly doped well for N channel MOS transistor formation 136b and N⁻ well comprising a collector sinker region 137a, collector region 137b and lightly doped well for forming an P channel MOS transistor 137c are formed. In that case, the concentration of the base 136a and lightly doped well for forming an N channel MOS transistor 136b which work as a P⁻ well is about $2 \times 10^{16}$ cm$^{-3}$ and a diffusion depth thereof is about 1.5 microns. Further, an SiO₂ film 138 and a nitride film 139 are formed and etched to have a desired shape in the same manner as Example 1. Then, in order to prevent the reverse of the P⁻ well surface and to control avalanche breakdown between the N⁺ type collector contact diffusion region and P⁻ base of the electrostatic discharge protection device, $^{11}B^+$ ions are implanted by using a mask 140 in the same manner as Example 1.

Figure 63:
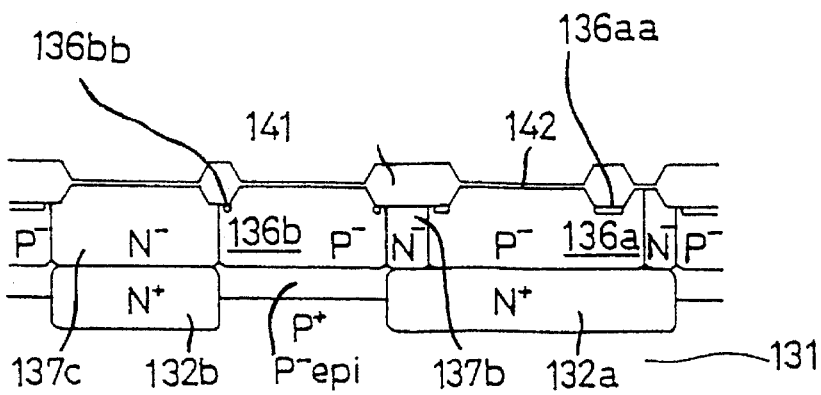
FIGS. 63 to 66 are a sectional view of a semiconductor device in each step of a second half of manufacturing process of Example 7.

Next, as shown in FIG. 63, after forming a highly doped diffusion regions 136aa and 136bb for controlling avalanche breakdown voltage between an N⁺ collector contact diffusion region and P⁻ base of the electrostatic discharge protection device and for preventing the reverse of the surface of the P⁻ well, a field oxide film as a device isolation region 141 and a gate oxide film 142 are formed. In that case, the concentration of the highly doped region 136aa is about $1 \times 10^{17}$ cm$^{-3}$. The highly doped region 136aa is formed so as to locate under the device isolation region 141 and contact with a collector contact diffusion region to be formed in the following step.

Figure 64:
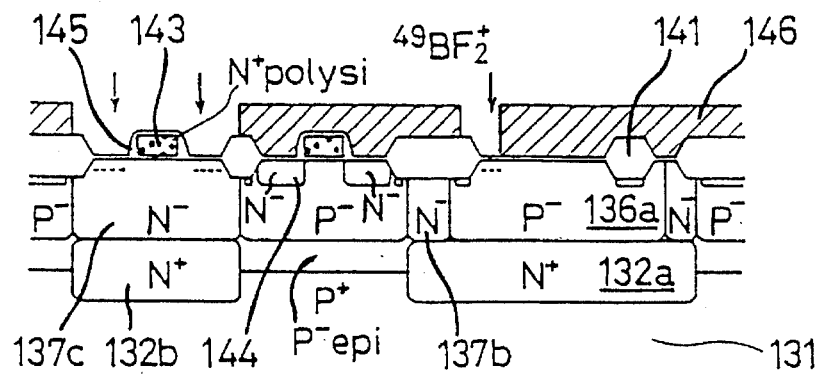

As shown in FIG. 64, a gate electrode 143 of the MOS transistor, an N⁻ diffusion region 144 of N channel MOS having LDD structure and a side wall spacer 145 are formed in the same manner as Example 1. Subsequently, $^{49}BF_2^+$ ions are implanted by using a mask 146 for forming a base contact diffusion region of the electrostatic discharge protection device and a source/drain region of P channel MOS.

Figure 65:
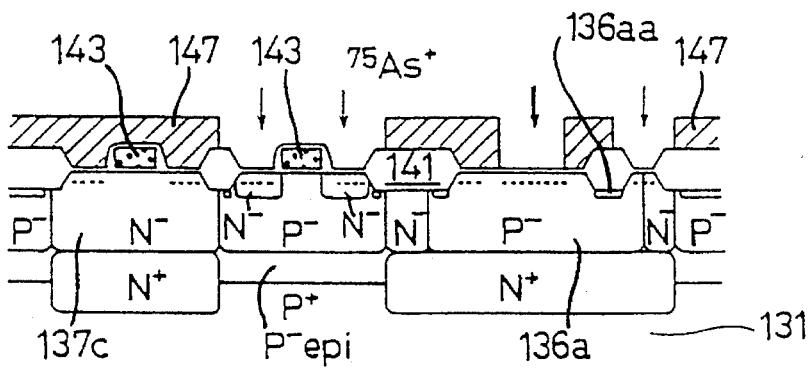

Next, as shown in FIG. 65, $^{75}As^+$ ions are implanted by using a mask 147 in the same manner as Example 1 for forming an emitter and a collector contact diffusion region in the electrostatic discharge protection device and a source/drain region of N channel MOS.

Figure 66:
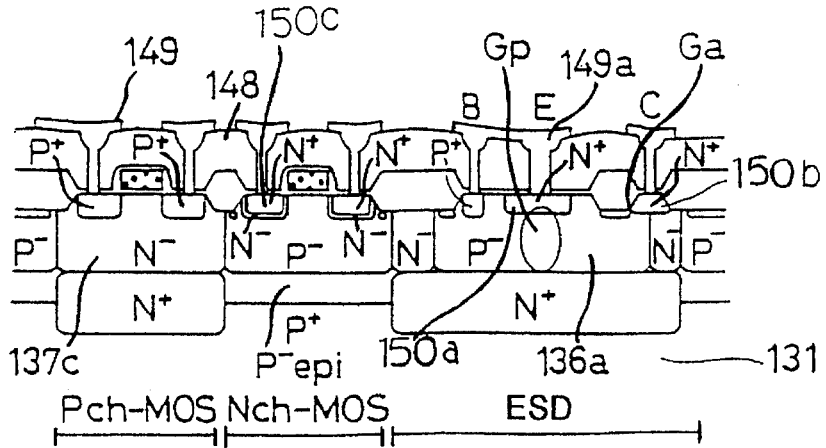

Further, as shown in FIG. 66, after forming an emitter 150a, collector contact diffusion region 150b connected with a highly doped diffusion region 136aa of the electrostatic discharge protection device and source/drain region 150c of N channel MOS, an NSG/BPSG film 148 and metal wiring 149 are formed on the surface of the semiconductor substrate 131 in the same manner as Example 1. Then, the emitter and base of the electrostatic discharge protection device are shorted with a metal 149a.

FIG. 57 shows a plan view of thus formed electrostatic discharge protection device in the semiconductor device and FIG. 10 shows a concentration profile beneath the emitter of the electrostatic discharge protection device.

When a reverse bias is applied to the collector of the bipolar transistor of this type used for the electrostatic discharge protection device in which the epitaxial layer has a desired thickness or less, punch-through occurs in a region shown as region Gp in FIG. 66, whereby an electric current starts flowing. If the reverse bias is further applied, transistor function and snap-back occur at about 14 V, and collector voltage reduces, whereby the electric current increases further as shown in FIG. 11.

If the thickness of the epitaxial layer is formed to a thickness thicker than the desired thickness, the punch-through breakdown voltage is shifted to a higher voltage. Accordingly, the avalanche breakdown occurs at about 14 V in the base (P⁻) and the horizontal collector (N⁺) before snap-back occurs triggered by punch-through (shown as region Ga in FIG. 66). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 7 showing a part of the semiconductor device comprising bipolar transistor of the electrostatic discharge protection device.

The electrostatic discharge protection device of the present example does not comprise a plug diffusion region, but the plug diffusion region may be formed in an additional step. Further, both of the N⁺ buried diffusion region and epitaxial layer are formed in the present example, but N⁺ buried diffusion region may be also formed without providing an epitaxial layer by implanting high energy.

EXAMPLE 8

Example 8 relates to CMOS type semiconductor device comprising a vertical type bipolar transistor as an electrostatic discharge protection device which causes snap-back triggered by an avalanche breakdown that can compensate high punch-through breakdown voltage caused by a variety of thickness of the epitaxial layer in the manufacturing process.

Figure 67:
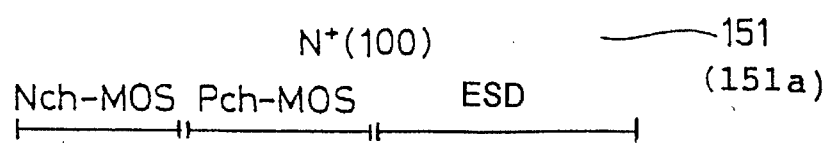
FIGS. 67 to 70 are a sectional view of a semiconductor device in each step of a first half of manufacturing process of Example 8.

As shown in FIG. 67, N⁺ type silicon substrate 151 is used.

Figure 68:
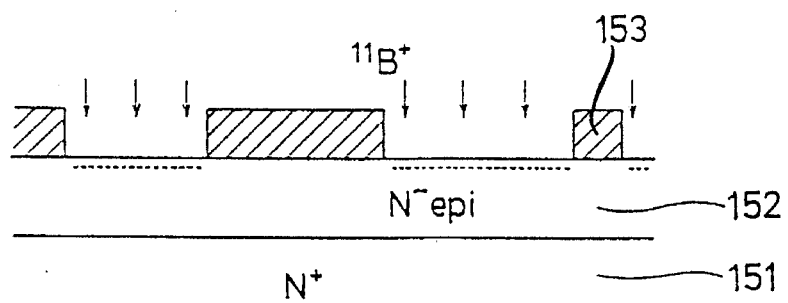

As shown in FIG. 68, an N⁻ epitaxial layer 152 is grown with a thickness of about 3.1 micron on the substrate 151 in the same manner as Example 1. Next, $^{11}B^+$ ions are implanted by using a mask 153 for forming a P⁻ well having a relatively high resistivity which is used for a base region of the electrostatic discharge protection device and N channel MOS.

Figure 69:
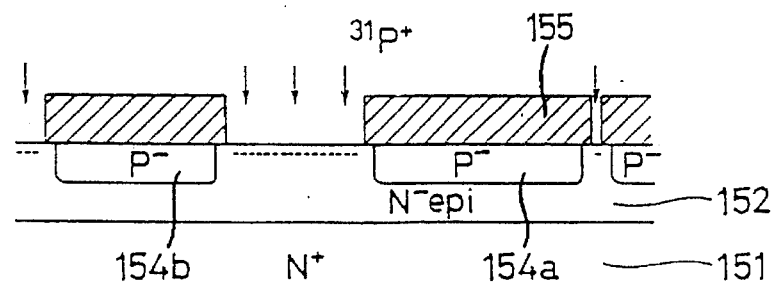

Subsequently, as shown in FIG. 69, $^{31}P^+$ ions are implanted to obtain an N⁻ well which is used for a collector region of the electrostatic discharge protection device and P channel MOS region by using a mask 155.

Figure 70:
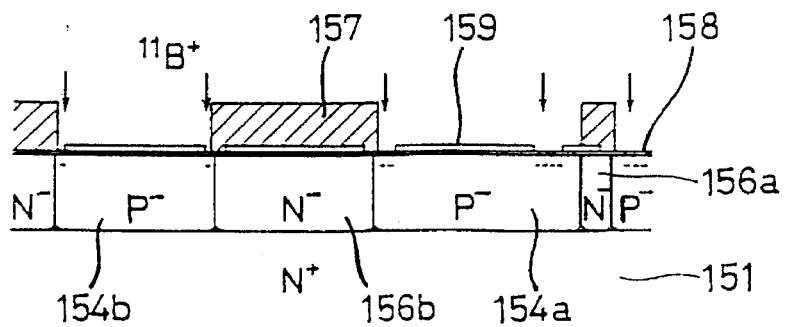

As shown in FIG. 70, a P⁻ well comprising a base 154a, lightly doped well for N channel MOS transistor formation 154b and N⁻ well comprising a collector sinker region 156a and lightly doped well for P channel MOS transistor formation region 156b are formed. In that case, the concentration of the base 154a and lightly doped well for forming an N channel transistor 154b which work as a P⁻ well is about $2 \times 10^{16}$ cm⁻³ and a diffusion depth thereof is about 1.5 microns. Further, an $SiO_2$ film 158 and a nitride film 159 are formed in the same manner as Example 1 and etched to have a desired shape. Then, in order to prevent the reverse of the P⁻ well surface and to control avalanche breakdown voltage between the N⁺ type collector contact diffusion region and P⁻ base of the electrostatic discharge protection device, $^{11}B^+$ ions are implanted in the same manner as Example 1.

Figure 71:
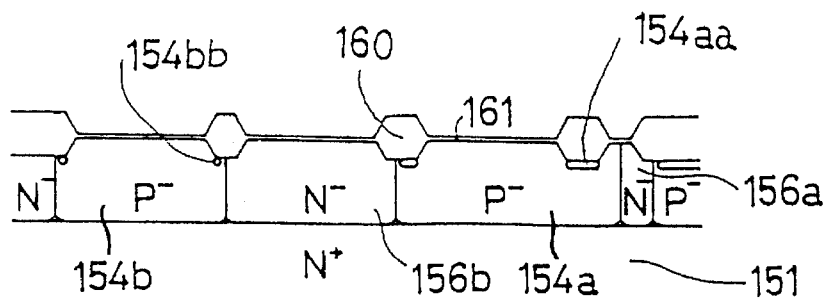
FIGS. 71 to 74 are a sectional view of a semiconductor device in each step of a second half of manufacturing process of Example 8.

Next, as shown in FIG. 71, after forming a highly doped diffusion regions 154aa and 154bb for controlling avalanche breakdown voltage between an N⁺ collector contact diffusion region and P⁻ base of the electrostatic discharge protection device and for preventing the reverse of the surface of the P⁻ well, a field oxide film as a device isolation region 160 and a gate oxide film 161 are formed in the same manner as Example 1. In that case, the concentration of the highly doped region 154aa is about $1 \times 10^{17}$ cm⁻³. The highly doped region 154aa is formed so as to locate under the device isolation region 141 and contact with a collector contact diffusion region to be formed in the following step.

Figure 72:
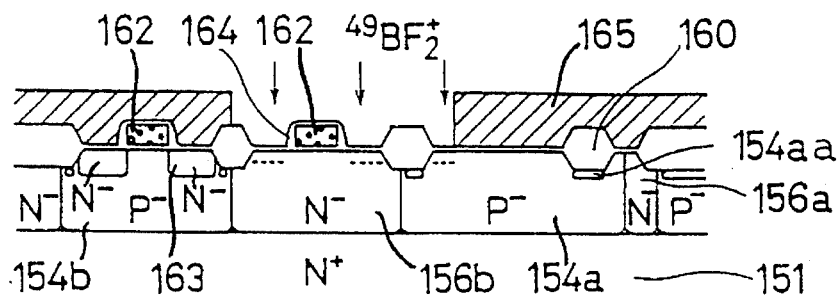

As shown in FIG. 72, a gate electrode 162 of the MOS transistor, an N⁻ diffusion region 163 of N channel MOS having LDD structure and a side wall spacer 164 are formed. Subsequently, $^{49}BF_2^+$ ions are implanted by using a mask 165 for forming a base contact diffusion region of the electrostatic discharge protection device and a source/drain of the P channel MOS.

Figure 73:
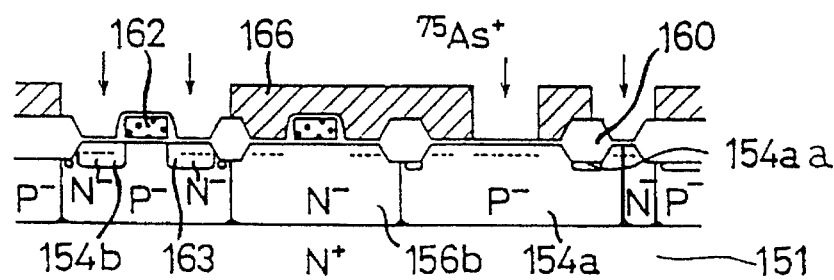

Next, as shown in FIG. 73, $^{75}As^+$ ions are implanted by using a mask 166 in the same manner as Example 1 for forming an emitter and a collector contact diffusion region in the electrostatic discharge protection device and a source/drain region of N channel MOS.

Figure 74:
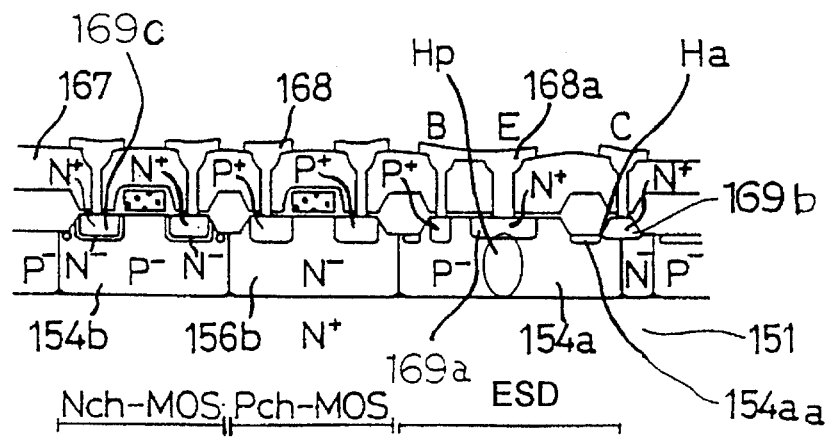

Further, as shown in FIG. 74, after forming an emitter 169a, collector contact diffusion region 169b connected with a highly doped diffusion region 154aa of the electrostatic discharge protection device and source/drain region 169c of N channel MOS, an NSG/BPSG film 167 and metal wiring 168 are formed in the same manner as Example 1. Then, the emitter and base of the electrostatic discharge protection device are shorted with a metal 168a.

Figure 75:
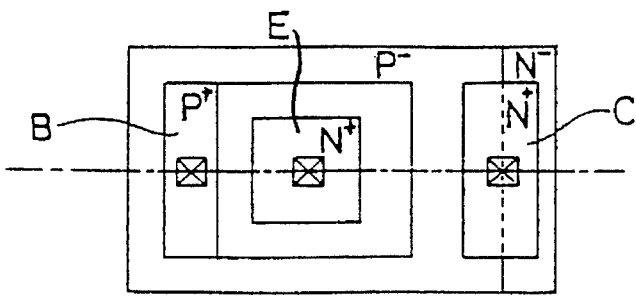
FIG. 75 is a plan view showing an arrangement of a diffusion region of an electrostatic discharge protection device of a semiconductor device of Example 8.

FIG. 75 shows a plan view of thus formed electrostatic discharge protection device in the semiconductor device and FIG. 30 shows a concentration profile beneath the emitter of the electrostatic discharge protection device.

When a reverse bias is applied to the collector of the bipolar transistor of this type used for the electrostatic discharge protection device in which the epitaxial layer has a desired thickness or less, punch-through occurs in a region shown as region Hp in FIG. 74, whereby an electric current starts flowing. If the reverse bias is further applied, transistor function and snap-back occur, whereby the electric current increases further.

If the thickness of the epitaxial layer is formed to a thickness thicker than the desired thickness, the punch-through breakdown voltage is shifted to a higher voltage. Accordingly, the avalanche breakdown occurs at about 14 V in the base (P⁻) and the horizontal collector (N⁺) before snap-back occurs triggered by punch-through (shown as region Ha in FIG. 74). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 8 showing a part of the semiconductor device comprising bipolar transistor of the electrostatic discharge protection device. Incidentally, since the present example employs N⁺ substrate as a collector, N⁺ substrate becomes $V_{DD}$ and works as a protection device only for the $V_{DD}$ side (upper side) in FIG. 12. Therefore, another protection device is required for GND side. In that case, it is not necessary to have an N⁻ well (collector), N⁺ collector contact diffusion region and metal wiring (collector) of the electrostatic discharge protection device employed in the present example. If the polarity of the electrostatic discharge protection device is opposite to the present example, the P⁺ substrate is used and grounded, and it works as a protection device only for the GND side.

The electrostatic discharge protection device of the present example does not comprise a plug diffusion region, but the plug diffusion region may be formed in an additional step.

EXAMPLE 9

Example 9 relates to a bipolar transistor type semiconductor device comprising a vertical type bipolar transistor as an electrostatic discharge protection device which causes snap-back triggered by an avalanche breakdown that can compensate high punch-through breakdown voltage caused by a variety of thickness of the epitaxial layer in the manufacturing process.

Figure 76:
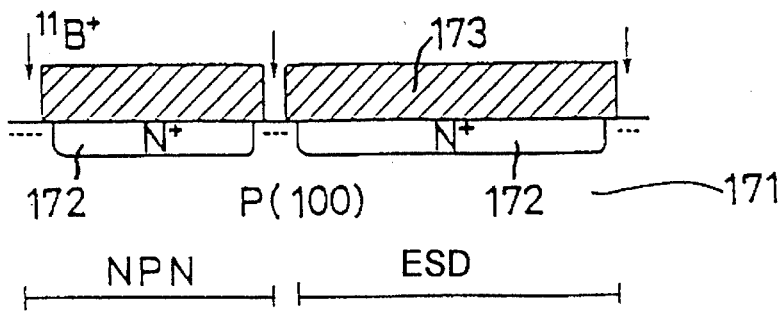
FIGS. 76 to 79 are a sectional view of a semiconductor device in each step of a first half of manufacturing process of Example 9 of the present invention.

An N⁺ diffusion region 172 is formed in an N⁺ buried collector formation region of the electrostatic discharge protection device and NPN transistor on a P type silicon substrate 171 in the same manner as Example 1 as shown in FIG. 76. Then, $^{11}B^+$ ions are implanted by using a mask 173 for forming a P⁺ buried layer.

Figure 77:
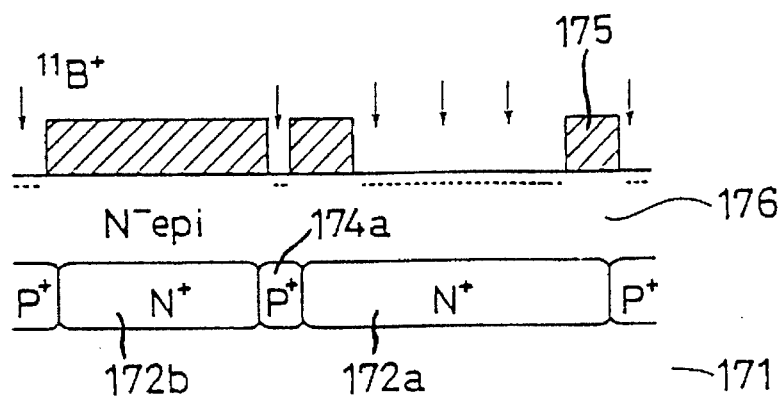

As shown in FIG. 77, an N⁻ epitaxial layer 176 is grown with a thickness of about 3.1 micron, and a buried collector 172a of the electrostatic discharge protection device, buried collector 172b of the NPN transistor for general use are formed in the same manner as Example 1. Next, $^{11}B^+$ ions are implanted by using a mask 175 for forming a P⁻ well having a relatively high resistivity which works as a base region and device isolation region in the same manner as Example 1.

Figure 78:
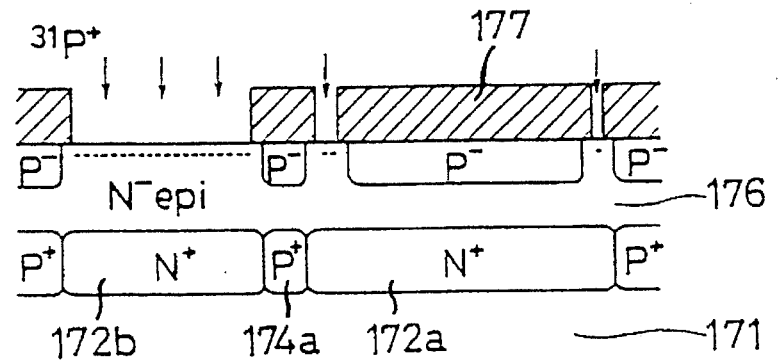

Subsequently, as shown in FIG. 78, $^{31}P^+$ ions are implanted to obtain an N⁻ well which works as a collector region of the electrostatic discharge protection device and NPN transistor by using a mask 177.

Figure 79:
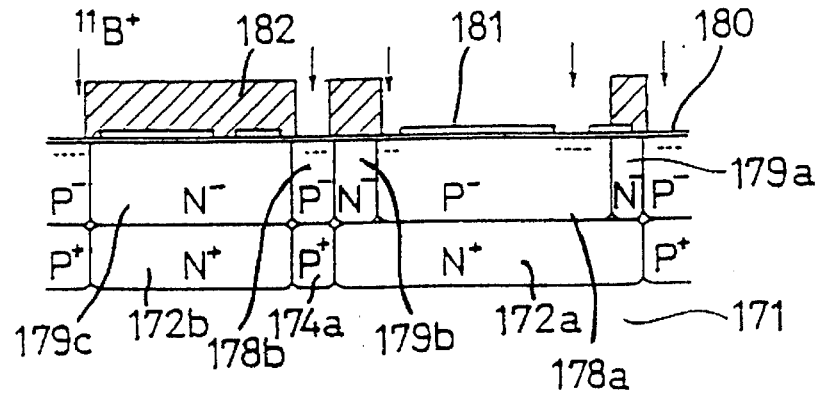

As shown in FIG. 79, a P⁻ well comprising a base 178a, lightly doped well for device isolation 178b and N⁻ well comprising a collector sinker region 179a, collector region 179b and collector 179c of NPN are formed. In that case, the concentration of the base 178a and lightly doped well for device isolation 178b which works as a P⁻ well is about $2\times10^{16}$ cm⁻³ and a diffusion depth thereof is about 1.5 microns. Further, an SiO₂ film 180 and a nitride film 181 are formed in the same manner as Example 1 and etched to have a desired shape. Then, in order to prevent the reverse of the P⁻ well surface and to control avalanche breakdown between the N⁺ plug diffusion and P⁻ base of the electrostatic discharge protection device, ¹¹B⁺ ions are implanted by using a mask 182 in the same manner as Example 1.

Figure 80:
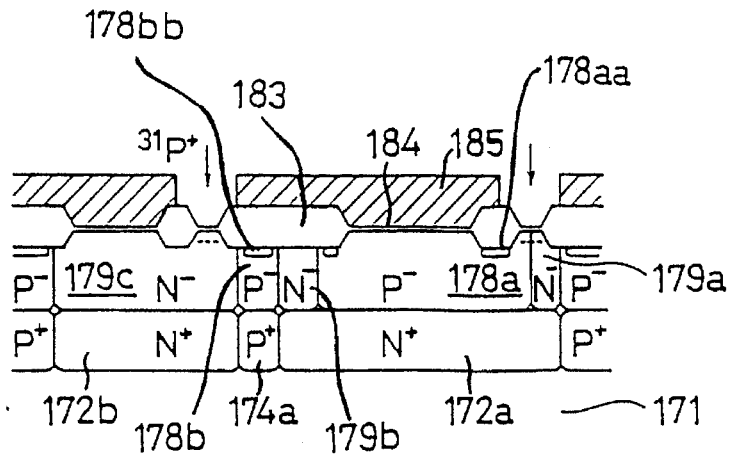
FIGS. 80 to 83 are a sectional view of a semiconductor device in each step of a second half of manufacturing process of Example 9.

Next, as shown in FIG. 80, after forming a highly doped diffusion regions 178aa and 178bb for controlling avalanche breakdown voltage between an N⁺ collector contact diffusion region and P⁻ base of the electrostatic discharge protection device and for preventing the reverse of the surface of the P⁻ well, a field oxide film as a device isolation region 183 and a gate oxide film 184 are formed in the same manner as Example 1. In that case, the concentration of the highly doped region 178aa is about $1\times10^{17}$ cm⁻³. The highly doped region 178aa is formed so as to locate under the device isolation region 183 and contact with a collector contact diffusion region to be formed in the following step. Then, ³¹P⁺ ions are implanted by using a mask 185 for forming an N⁺ plug diffusion region (about $3\times10^{19}$ cm⁻³) in the collector region of the electrostatic discharge protection device and NPN transistor.

Figure 81:
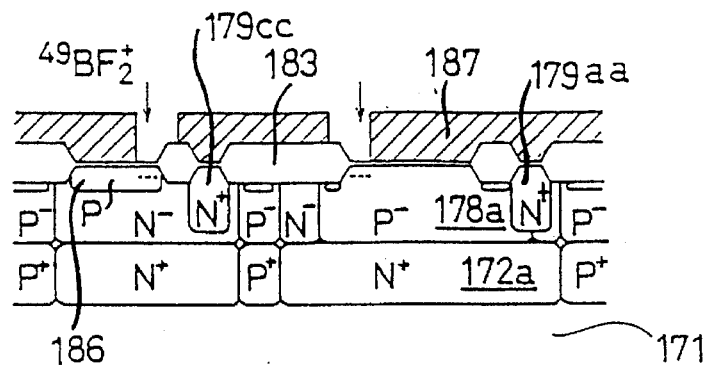

As shown in FIG. 81, after forming an N⁺ plug diffusion region 179aa, an active base 186 of NPN transistor is formed. Then, ⁴⁹BF⁺ ions are implanted by using a mask 187 for forming a base contact diffusion region of the electrostatic discharge protection device and NPN transistor.

Figure 82:
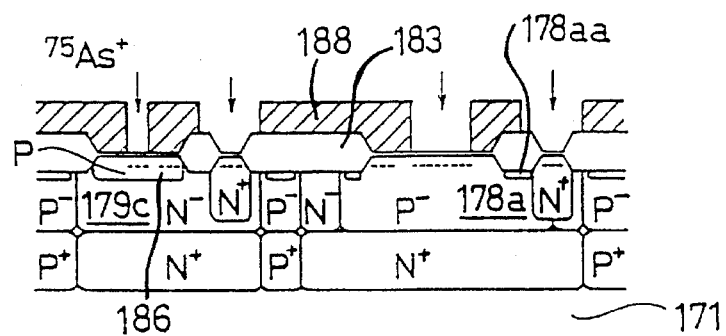

Further, as shown in FIG. 82, ⁷⁵As⁺ ions are implanted by using a mask 188 for forming an emitter and a collector contact diffusion region (about $2\times10^{20}$ cm⁻³) of the electrostatic discharge protection device and NPN transistor.

Figure 83:
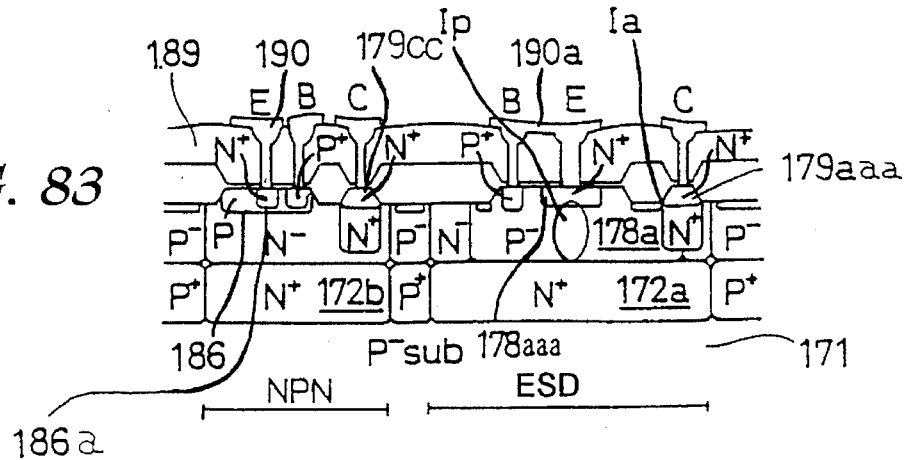

Subsequently, as shown in FIG. 83, after forming an emitter 178aaa of the electrostatic discharge protection device, an emitter 186a of the NPN transistor, a collector contact diffusion region 179aaa of the electrostatic discharge protection device connected with a collector contact diffusion region 178aa, an NSG/BPSG film 189 and a metal wiring 190 are formed on the surface of a semiconductor substrate 171 in the same manner as Example 1. Then, the emitter and base of the electrostatic discharge protection device are connected with a metal 190a.

Figure 84:
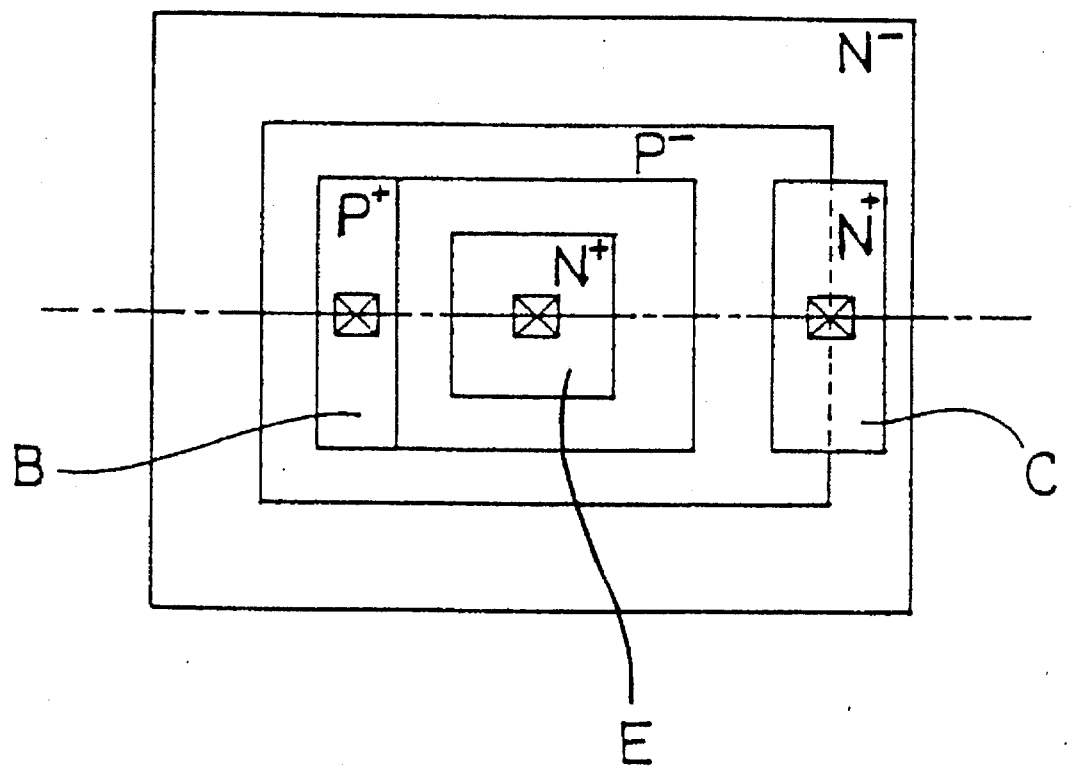
FIG. 84 is a plan view showing an arrangement of a diffusion region of an electrostatic discharge protection device of a semiconductor device of Examples 9 and 10.

FIG. 84 shows a plan view of thus formed electrostatic discharge protection device in the semiconductor device and FIG. 40 shows a concentration profile beneath the emitter of the electrostatic discharge protection device.

When a reverse bias is applied to the collector of the bipolar transistor of this type used for the electrostatic discharge protection device in which the epitaxial layer has a desired thickness or less, punch-through occurs in a region shown as region Ip in FIG. 83. If the reverse bias is further applied, transistor function and snap-back occur. As a result, the electric current increases further.

If the thickness of the epitaxial layer is formed to a thickness thicker than the desired thickness, the punch-through breakdown voltage is shifted to a higher voltage. Accordingly, the avalanche breakdown occurs at about 14 V in the base (P⁻) and the horizontal collector (N⁺) before snap-back occurred triggered by the punch-through (shown as region Ia in FIG. 83). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 9 showing a part of the semiconductor device comprising bipolar transistor working as the electrostatic discharge protection device.

EXAMPLE 10

Example 9 relates to BiCMOS type semiconductor device comprising a vertical type bipolar transistor as an electrostatic discharge protection device which causes snap-back triggered by an avalanche breakdown that can compensate high punch-through breakdown voltage caused by a variety of thickness of the epitaxial layer if the manufacturing process.

Figure 85:
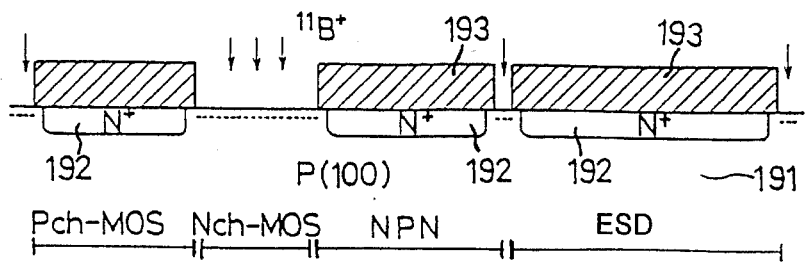
FIGS. 85 to 88 are a sectional view of a semiconductor device in each step of a first half of manufacturing process of Example 10.

An N⁺ diffusion region 192 is formed in an N⁺ buried collector formation region of the electrostatic discharge protection device and P channel MOS formation region and N⁺ buried collector region of NPN transistor on a P type silicon substrate 191, respectively, in the same manner as Example 1 as shown in FIG. 85. Then, ¹¹B⁺ ions are implanted (50 KeV, $1\times10^{14}$ cm⁻²) in a region of N channel MOS and device isolation to be formed by using a mask 193 for forming a P⁺ buried layer.

Figure 86:
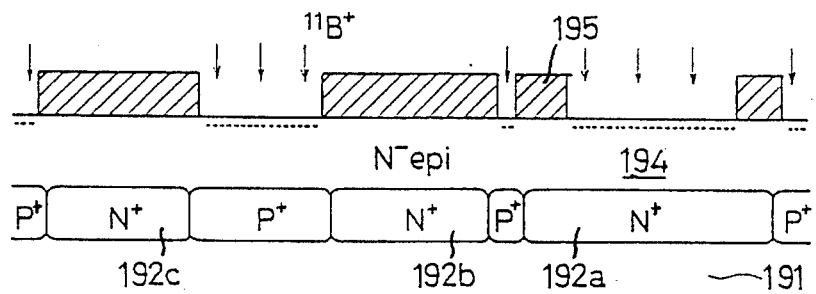

As shown in FIG. 86, an N⁻ epitaxial region 194 is grown with a thickness of about 3.1 micron, buried collectors 192a, 192b and buried layer 192c are formed. Next, ¹¹B⁺ ions are implanted by using a mask 195 for forming a P⁻ well having a relatively high resistivity which works as a base region of the electrostatic discharge protection device, N channel MOS and device isolation region.

Figure 87:
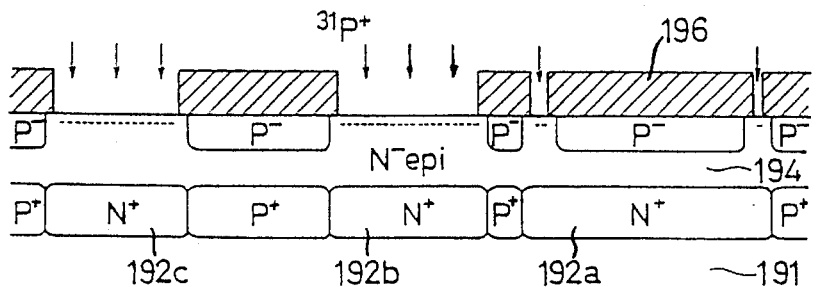

Subsequently, as shown in FIG. 87, ³¹P⁺ ions are implanted by using a mask 196 to obtain a collector region of the electrostatic discharge protection device and NPN transistor and an N⁻ well which works as a P channel MOS.

Figure 88:
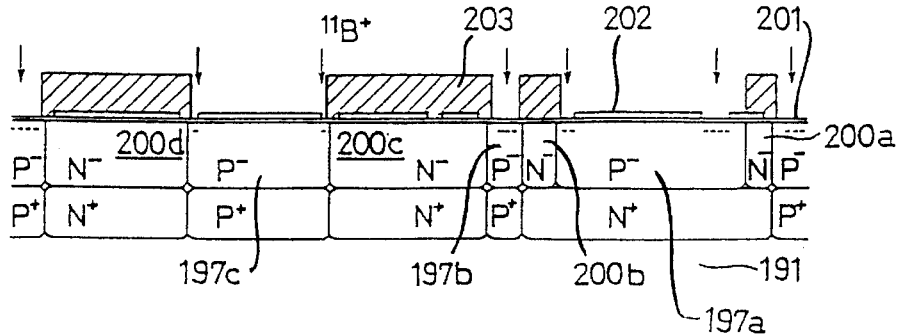

As shown in FIG. 88, a P⁻ well comprising a base 197a, lightly doped well for device isolation 197b and lightly doped well for forming N channel MOS 197c and an N⁻ well comprising a collector sinker region 200a, collector of NPN 200b and lightly doped impurity well for forming P channel MOS 200c are formed. In that case, the concentration of the base 197a and lightly doped well for device isolation 197b and lightly doped well for forming N channel MOS 197c is about $2\times10^{16}$ cm⁻³ and a diffusion depth thereof is about 1.5 microns. Further, an SiO₂ film 201 and a nitride film 202 are formed and etched to have a desired shape in the same manner as Example 1. Then, in order to prevent the reverse of the P⁻ well surface, ¹¹B⁺ ions are implanted by using a mask 203 in the same manner as Example 1.

Figure 89:
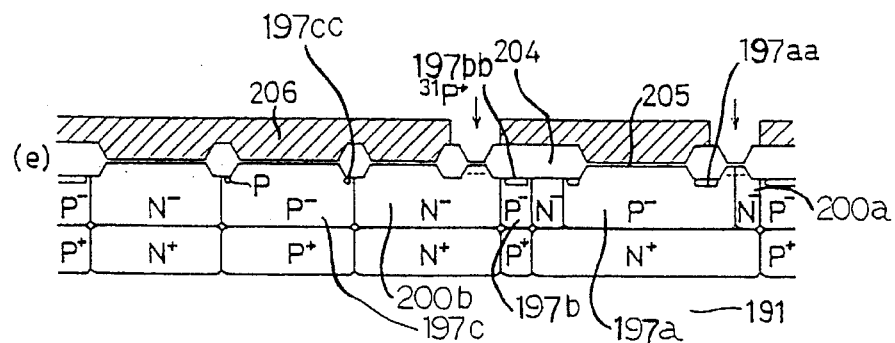
FIGS. 89 to 92 are a sectional view of a semiconductor device in each step of a second half of manufacturing process of Example 10.

Next, as shown in FIG. 89, after forming a highly doped diffusion regions 197aa and 197bb for controlling avalanche breakdown voltage between an N⁺ collector contact diffusion region and P⁻ base of the electrostatic discharge protection device and for preventing the reverse of the surface of the P⁻ well, a field oxide film as a device isolation region 204 and a gate oxide film 205 are formed in the same manner as Example 1. In that case, the concentration of the highly doped region 197aa is about $1\times10^{17}$ cm⁻³. The highly doped region 197aa is formed so as to locate under the device isolation region 204 and contact with a collector contact diffusion region to be formed in the following step. Then, ³¹P⁺ ions are implanted by using a mask 206 for forming an N⁺ plug diffusion region (about $3\times10^{19}$ cm⁻³) in the collector region of the electrostatic discharge protection device and NPN transistor.

Figure 90:
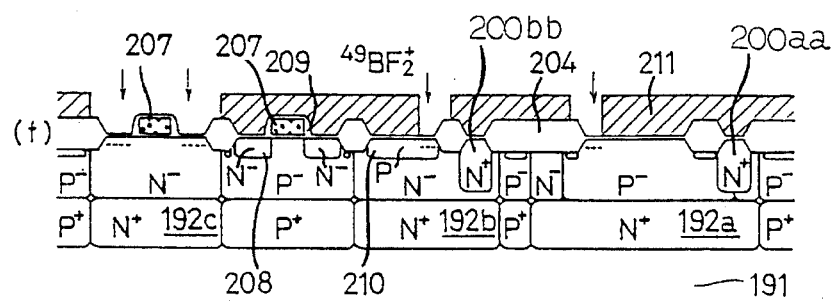

As shown in FIG. 90, after forming an N⁺ plug diffusion region 200aa, a gate electrode 207 of MOS transistor, N⁻ diffusion region of N channel MOS 208 having LDD structure, an active base 210 and a side wall spacer 209 are formed in the same manner as Example 1. Then, $^{49}BF^+$ ions are implanted by using a mask 211 for forming a base contact diffusion region of the electrostatic discharge protection device and NPN transistor and source/drain of P channel MOS.

Figure 91:
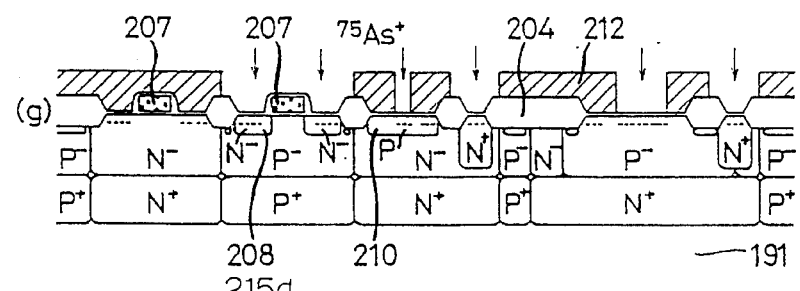

Subsequently, as shown in FIG. 91, $^{75}As^+$ ions are implanted by using a mask 212 for forming an emitter and a collector contact diffusion region of the electrostatic discharge protection device and NPN transistor and source/drain of N channel MOS.

Figure 92:
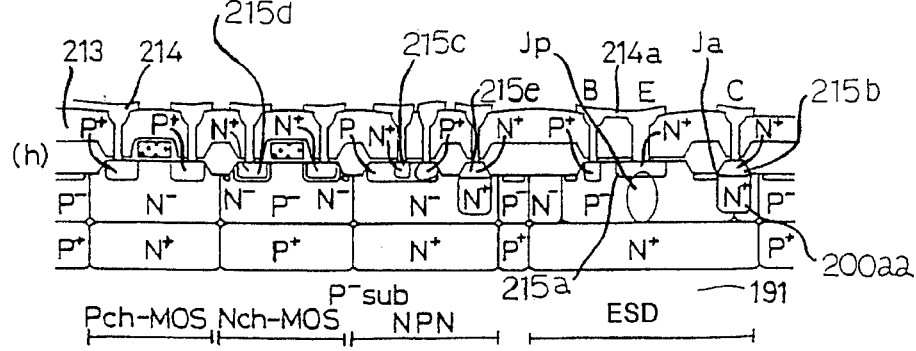

Further, as shown in FIG. 92, after forming an emitter 215a of the electrostatic discharge protection device, emitter 215c of the NPN transistor, collector contact diffusion region 215b and source/drain region 215d of N channel MOS, an NSG/BPSG film 189 and metal wiring 214 are formed on the surface of a semiconductor substrate 191 in the same manner as Example 1. Then, the emitter and base of the electrostatic discharge protection device are shorted with a metal 214a.

FIG. 84 shows a plan view of thus formed electrostatic discharge protection device in the semiconductor device and FIG. 40 shows a concentration profile beneath the emitter of the electrostatic discharge protection device.

When a reverse bias is applied to the collector of the bipolar transistor of this type used for the electrostatic discharge protection device in which the epitaxial layer has a desired thickness or less, punch-through occurs in a region shown as Jp in FIG. 92, whereby an electric current starts flowing. If the reverse bias is further applied, transistor function and snap-back occur and the electric current increases further.

If the thickness of the epitaxial layer is formed to a thickness thicker than the desired thickness, the punch-through breakdown voltage is shifted to a higher voltage. Accordingly, the avalanche breakdown occurs at about 14 V in the base (P⁻) and the horizontal collector (N⁺) before snap-back occurs triggered by the punch-through (shown as Ja in FIG. 92).

The emitter junction is biased transitionally to the forward direction because of the decrease of voltage in the base having a high resistivity. As a result, transistor function and snap-back occur by using the avalanche breakdown as a trigger as shown in FIG. 58, whereby a great electric current flows.

FIG. 12 also shows an equivalent circuit of Example 10 showing a part of the semiconductor device comprising bipolar transistor working as the electrostatic discharge protection device.

As described above, the present invention provides a semiconductor device comprising an electrostatic discharge protection device, in which a vertical type bipolar transistor having a buried collector of a first conductive type, base of a second conductive type and emitter of the first conductive type are included; an impurity concentration of the base of the second conductive type of the vertical type bipolar transistor ranges from about $1 \times 10^{16}$ cm$^{-3}$ to $3 \times 10^{16}$ cm$^{-3}$ the depth of the diffusion of the base of the second conductive type ranges from 0.8 to 2.3 microns; and the base of the second conductive type and the emitter of the first conductive type are shorted with each other. According to the electrostatic discharge protection device of this type, punch-through breakdown occurs as a trigger between the collector and emitter, thereby inducing snap-back. Accordingly, a depletion region is extended all over the emitter region and the concentration of electric field is prevented, so that electric current is not concentrated. As a result, a device is prevented from breakdown caused by heat generation such as avalanche breakdown trigger.

The present invention also provides a semiconductor device comprising an electrostatic discharge protection device, in which a vertical type bipolar transistor having a buried collector of a first conductive type, base of a second conductive type, emitter of the first conductive type and highly doped diffusion region in the surface layer are included; the base of the second conductive type is a surface layer and comprises a highly doped diffusion region which contacts at least with the collector contact diffusion region in the collector sinker region of the first conductive type; the impurity concentration of the base of the second conductive type ranges from about $1 \times 10^{16}$ cm$^{-3}$ to $3 \times 10^{16}$ cm$^{-3}$ and the depth of the diffusion of the base of the second conductive type ranges from 0.8 to 2.3 microns; and the base of the second conductive type and the emitter of the first conductive type are connected with each other. According to the electrostatic discharge protection device of this type, avalanche breakdown voltage is made stable, whereby the breakdown of the inner circuit caused by the voltage shift can be prevented.

Therefore, it is possible to provide a semiconductor device comprising the electrostatic discharge protection device which is capable of preventing a circuit from breakdown caused by applying excessive voltage.

Moreover, according to the method of the present invention, the device can be formed in the process for forming the P channel MOS, N channel MOS, CMOS, bipolar transistor and BiCMOS which are included in the device without adding a specific step, thereby reducing a production cost by simplifying manufacturing steps.

What we claimed is:

1. A semiconductor device having an electrostatic discharge protection device, in which the electrostatic discharge protection device comprises a vertical type bipolar transistor including, a semiconductor substrate, an epitaxial layer laminated on the semiconductor substrate, a buried collector of a first conductive type which is formed of the semiconductor substrate or which is formed from the surface of the semiconductor substrate to the epitaxial layer, a base of a second conductive type which is a lightly doped well and formed on the epitaxial layer, and an emitter of the first conductive type and formed on the surface layer of the base of the second conductive type; and in which the depth of the diffusion of the base being in the range from 0.8 to 2.3 microns, and the base and the emitter being shorted with each other.

2. A semiconductor device according to claim 1, in which the impurity concentration of the base is in the range from about $1 \times 10^{16}$ cm$^{-3}$ to $3 \times 10^{16}$ cm$^{-3}$.

3. A semiconductor device according to claim 1, which comprises an N or P channel MOS or CMOS transistor.

4. A semiconductor device according to claim 1, which comprises a bipolar transistor.

5. A semiconductor device according to claim 1, which comprises a BiCMOS transistor.

6. A semiconductor device having an electrostatic discharge protection device, in which the electrostatic discharge protection device comprises a vertical type bipolar transistor including, a semiconductor substrate, an epitaxial layer laminated on the semiconductor substrate, a buried collector of a first conductive type which is formed of the semiconductor substrate or which is formed from the surface of the semiconductor substrate to the epitaxial layer, a base of a second conductive type which is a lightly doped well and formed on the epitaxial layer, an emitter of the first conductive type and formed on the surface layer of the base of the second conductive type and a collector sinker region of the first conductive type which is adjacent to the base of the second conductive type and provided with a collector contact diffusion region;

the base comprising a highly doped diffusion layer of the second conductive type, which contacts at least with the collector contact diffusion region in the collector sinker region of the first conductive type, the depth of the diffusion of the base of the second conductive type being in the range from 0.8 to 2.3 microns, and the base type and the emitter being shorted with each other.

7. A semiconductor device according to claim 6, in which the impurity concentration of the base is in the range from about $1\times10^{16}$ cm$^{-3}$ to $3\times10^{16}$ cm$^{-3}$.

8. A semiconductor device according to claim 6, in which a plug diffusion layer of the first conductive type is formed bridging from the inside of the collector sinker region of the first conductive type to the inside of the base of the second conductive type, and the collector contact diffusion region of the second conductive type is in contact with the plug diffusion layer of the first conductive type.

9. A semiconductor device according to claim 6, the collector sinker region of the first conductive type ranges from about $6\times10^{16}$ to $2\times10^{17}$ cm$^{-3}$.

10. A semiconductor device according to claim 6, which comprises N or P channel MOS or CMOS.

11. A semiconductor device according to claim 6, which comprises a bipolar transistor.

12. A semiconductor device according to claim 6, which comprises BiCMOS.

* * * * *